United States Patent
Park et al.

(10) Patent No.: US 11,362,661 B2
(45) Date of Patent: Jun. 14, 2022

(54) MAGNETIC LOGIC DEVICE

(71) Applicant: Korea Advanced Institute of Science and Technology, Daejeon (KR)

(72) Inventors: Byong Guk Park, Daejeon (KR); Kab-Jin Kim, Daejeon (KR); Geun-hee Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/314,127

(22) Filed: May 7, 2021

(65) Prior Publication Data

US 2021/0351776 A1 Nov. 11, 2021

(30) Foreign Application Priority Data

May 7, 2020 (KR) .................. 10-2020-0054160

(51) Int. Cl.
*H03K 19/16* (2006.01)
*H01F 10/32* (2006.01)
*H03K 19/20* (2006.01)

(52) U.S. Cl.
CPC ......... *H03K 19/16* (2013.01); *H01F 10/3254* (2013.01); *H03K 19/20* (2013.01)

(58) Field of Classification Search
None
See application file for complete search history.

(56) References Cited

U.S. PATENT DOCUMENTS

| 9,559,698 | B2 | 1/2017 | Nikonov et al. |
| 9,979,402 | B2 | 5/2018 | Vaysset et al. |
| 10,062,449 | B2 | 8/2018 | Choe |
| 10,236,046 | B2 | 3/2019 | Vaysset |
| 2012/0299620 | A1 | 11/2012 | Apalkov et al. |
| 2013/0314978 | A1* | 11/2013 | Currivan ............... G11C 11/161 365/158 |
| 2017/0221577 | A1* | 8/2017 | Choe ................. G11C 19/0841 |
| 2021/0104344 | A1* | 4/2021 | Nguyen ................. H01L 43/12 |

FOREIGN PATENT DOCUMENTS

| KR | 1020120019115 A | 3/2012 |
| KR | 1020140016164 A | 2/2014 |
| KR | 1020160064077 A | 6/2016 |
| KR | 1020170090807 A | 8/2017 |
| KR | 101844128 B1 | 4/2018 |
| KR | 1020190017092 A | 2/2019 |

* cited by examiner

*Primary Examiner* — Jany Richardson
(74) *Attorney, Agent, or Firm* — The Webb Law Firm

(57) ABSTRACT

Disclosed is a magnetic logic device including: a plurality of input branches configured by a magnetic nanowire including a non-magnetic metallic layer, a free layer, and an insulating layer sequentially stacked; an output branch configured by the magnetic nanowire; a coupling portion configured by the magnetic nanowire and where the input branches and the output branch meet; gate electrodes arranged adjacent to the insulating layer in each of the plurality of input branches; and in-plane anisotropic ferromagnetic layers arranged adjacent to the non-magnetic metallic layer in each of the plurality of input branches.

8 Claims, 26 Drawing Sheets

Domain Writing

Domain Shifting/Logic Operation

Domain Reading

FIG. 5

Initial Mz= −1

| Logic input | | | Logic output | |
|---|---|---|---|---|
| $VG_A$ | $VG_B$ | $VG_C$ | $V_{out}$ (Initial Mz= −1) | |
| 0 | 0 | 0 | 0 | ⎫ |
| 0 | 0 | 1 | 0 | ⎬ AND |
| 0 | 1 | 0 | 0 | |
| 0 | 1 | 1 | 1 | ⎭ |
| 1 | 0 | 0 | 0 | ⎫ |
| 1 | 0 | 1 | 1 | ⎬ OR |
| 1 | 1 | 0 | 1 | |
| 1 | 1 | 1 | 1 | ⎭ |

Domain Shifting/Logic Operation

FIG. 12

Initial Mz= +1

| Logic input | | | Logic output | |
|---|---|---|---|---|
| $VG_A$ | $VG_B$ | $VG_C$ | $I_{out}$ (Initial Mz= +1) | |
| 0 | 0 | 0 | 1 | NAND |
| 0 | 0 | 1 | 1 | |
| 0 | 1 | 0 | 1 | |
| 0 | 1 | 1 | 0 | |
| 1 | 0 | 0 | 1 | NOR |
| 1 | 0 | 1 | 0 | |
| 1 | 1 | 0 | 0 | |
| 1 | 1 | 1 | 0 | |

Domain Shifting

1st Domain Wall Shifting

MAGNETIC LOGIC DEVICE

CROSS-REFERENCE TO RELATED APPLICATION

This application claims priority to Korean Patent Application No. 10-2020-0054160 filed May 7, 2020, the disclosure of which is hereby incorporated by reference in its entirety.

BACKGROUND OF THE INVENTION

Field of the Invention

The present invention relates to a magnetic logic device, and more particularly, to a magnetic device that performs a logic operation by shifting a magnetic domain wall by using a spin orbit torque.

Description of Related Art

A typical magnetic majority gate logic device uses a cross-shaped magnetic nanowire. Three branches are used as an input and one branch is used as an output. (U.S. Pat. No. 10,236,046 B2) writes information on a magnetic domain by using a spin transfer torque by using a magnetic tunnel junction. Further, for a logic operation, the magnetic domain applies current to the magnetic nanowire and performs the logic operation while shifting by the spin transfer torque.

However, the spin transfer torque has a limit in shift speed of a magnetic domain wall and a higher-speed logic operation is required. Further, a write operation using the spin transfer torque causes damage to a tunnel insulation layer.

SUMMARY OF THE INVENTION

The present invention has been made in an effort to provide a magnetic logic device capable of a high-speed operation.

The present invention has also been made in an effort to provide a magnetic logic device without deterioration of an insulating layer.

The present invention has also been made in an effort to provide a magnetic logic device which may selectively perform NAND/NOR or AND/OR.

An exemplary embodiment of the present invention provides a magnetic logic device including: a plurality of input branches configured by a magnetic nanowire including a non-magnetic metallic layer, a free layer, and an insulating layer sequentially stacked; an output branch configured by the magnetic nanowire; a coupling portion configured by the magnetic nanowire and where the input branches and the output branch meet; gate electrodes arranged adjacent to the insulating layer in each of the plurality of input branches; and in-plane anisotropic ferromagnetic layers arranged adjacent to the non-magnetic metallic layer in each of the plurality of input branches. A gate voltage applied to the gate electrodes reduces the perpendicular magnetic anisotropy of the free layer, the free layer has the perpendicular magnetic anisotropy, and the non-magnetic metallic layer and the free layer provide antisymmetric interaction. The write in-plane current applied to the input branch is synchronized with the gate voltage and locally provides, to a magnetic domain initially magnetized to a first state, by magnetic anisotropy reduced by the gate voltage. The magnetization inversion forms one pair of Neel magnetic domain walls. Information written in each of the input branches is shifting to a shift in-plane current and performing a logical operation at the coupling portion, and outputting an operation result to the output branch.

In an exemplary embodiment of the present invention, the non-magnetic metallic layer may be Pt, and the free layer may be CoFeB.

In an exemplary embodiment of the present invention, the number of input branches may be 3, the input branches and the output branches may be arranged in a cross form, and when the first state is a "down" state, the logic operation may be to perform AND and OR operations.

In an exemplary embodiment of the present invention, the number of input branches may be 3, the input branches and the output branches may be arranged in the cross form, and when the first state is an "up" state, the logic operation may be to perform NAND and NOR operations.

In an exemplary embodiment of the present invention, the magnetic logic device may further include a fixation layer disposed adjacent to the insulating layer in the output branch, and the free layer, the insulating layer, and the fixation layer may provide magnetic tunnel junction and the magnetic tunnel junction may detect the operation result.

Another exemplary embodiment of the present invention provides a magnetic logic device including: a plurality of input branches configured by a magnetic nanowire including a non-magnetic metallic layer, a free layer, and an insulating layer sequentially stacked; an output branch configured by the magnetic nanowire; a coupling portion configured by the magnetic nanowire and where the input branches and the output branch meet; gate electrodes arranged adjacent to the insulating layer in each of the plurality of input branches; and in-plane anisotropic ferromagnetic layers arranged adjacent to the non-magnetic metallic layer in each of the plurality of input branches. Yet another exemplary embodiment of the present invention provides an operating method of the magnetic logic device including: writing information by performing magnetization inversion of the free layer by applying the write in-plane current to the non-magnetic metallic layer of the input branches while applying the gate voltage to each of the gate electrodes to correspond to information provided from the outside; performing the logic operation in the coupling portion while shifting the written information by applying the shift in-plane current to the non-magnetic metallic layer of the input branches; and detecting information logically computed by the shift in-plane current of the non-magnetic metallic layer through a magnetic tunnel junction structure by shifting the information to the output branch.

In an exemplary embodiment of the present invention, the method may further include changing an initial magnetization state of the magnetic nanowire.

In an exemplary embodiment of the present invention, the changing of the initial magnetization state of the magnetic nanowire may include forming first and second magnetic domain walls by performing magnetization inversion of the free layer by applying a write in-plane current to the non-magnetic metallic layer of all input branches while applying a gate voltage to each of all gate electrodes, shifting the second magnetic domain wall to a boundary of the gate electrode by applying the shift in-plane current to the non-magnetic metallic layer of all input branches while removing the gate voltage of each of all gate electrodes, shifting the first magnetic domain wall to the end of the output branch while peening the second magnetic domain wall by applying the shift in-plane current to the non-magnetic metallic layer of all input branches while applying the gate voltage to each of all gate electrodes, and shifting the second magnetic domain wall to input terminals of the input branches by applying an opposite shift in-plane current to the non-magnetic metallic layer of all input branches while removing the gate voltage of each of all gate electrodes.

According to an exemplary embodiment of the present invention, a logic device performs a different logic operation according to an initial magnetization state of a free layer. The initial magnetization state of the free layer may be changed through a predetermined operation. Accordingly, various logic operations may be performed in the same device.

According to an exemplary embodiment of the present invention, the logic device may provide a rapid switching operation with a low write in-plane current by providing higher magnetization inversion than a spin transfer torque by using a spin orbit torque. Further, since a magnetic tunnel junction is not used in an information write operation, damage to a tunnel insulating layer is prevented, thereby increasing information write reliability.

According to an exemplary embodiment of the present invention, the logic device may perform a rapid computation operation by providing a fast shift speed by using the spin orbit torque.

BRIEF DESCRIPTION OF THE DRAWINGS

FIG. 5 illustrates a logic operation result of the magnetic logic device of FIG. 1A.

FIG. 12 illustrates a logic operation result of the magnetic logic device of FIG. 8A.

DESCRIPTION OF THE INVENTION

Figure 1A:
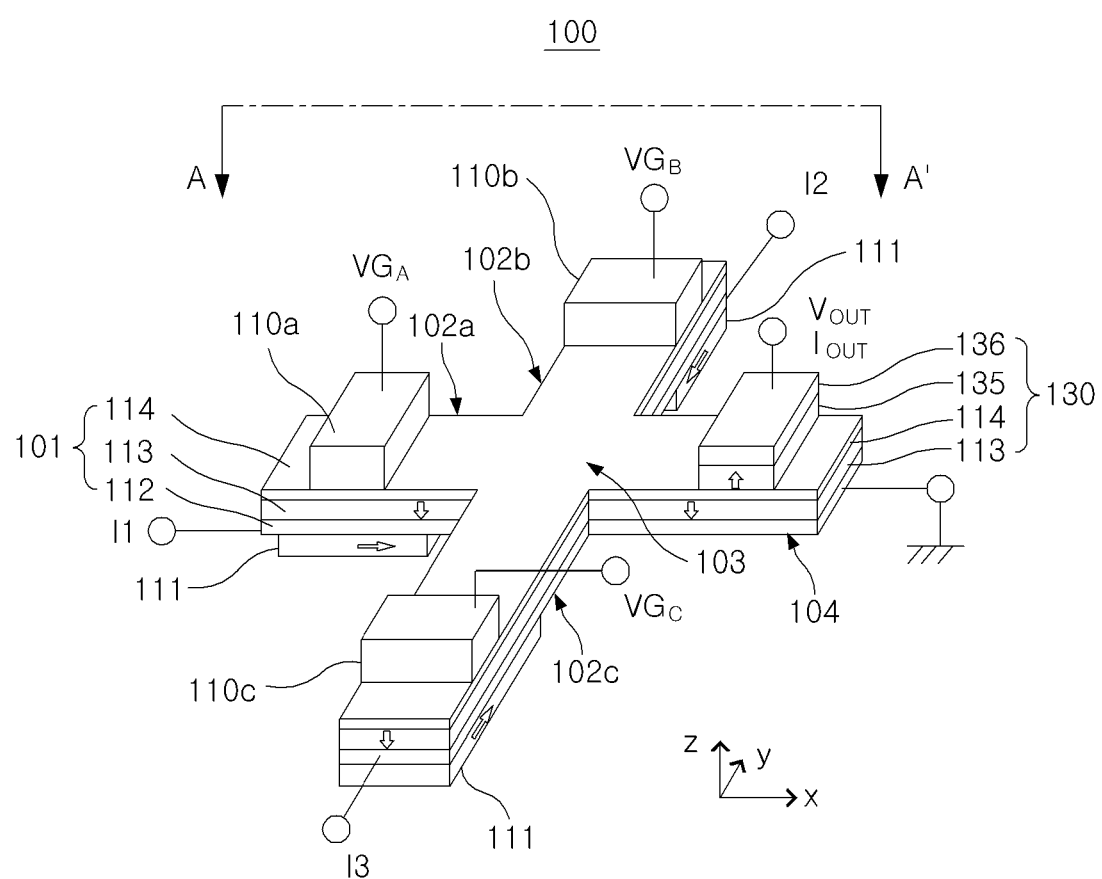
FIG. 1A is a perspective view illustrating a magnetic logic device according to an exemplary embodiment of the present invention.

Perpendicular magnetic anisotropy (PMA) is a state in which spins are aligned in a perpendicular direction to a plane. In a ferromagnetic thin film structure having the perpendicular magnetic anisotropy, a domain in which a magnetization direction is aligned in a parallel or antiparallel direction of the perpendicular direction is referred to as a magnetic domain, and a boundary between the magnetic domains is referred to as a magnetic domain wall.

A magnetic logic device according to an exemplary embodiment of the present invention uses a magnetic nanowire having a non-magnetic metallic layer/free layer/insulating layer structure. The logic device includes a plurality of input branches receiving and writing external information; an output branch computing the written information and then outputting the computed information; and a coupling portion coupling the input branches and the output branch, and performing a logic operation. The logic device has a cross shape. A gate electrode is disposed on an insulating layer of the input branches. The gate electrode applies a gate voltage corresponding to information received from the outside. The free layer has the perpendicular magnetic anisotropy, and the gate voltage applied to the gate electrode reduces magnetic anisotropy of the free layer. When the non-magnetic metallic layer and the free layer provide symmetric interaction, so that when the free layer is thus locally magnetization-switched by the gate voltage and a write in-plane current, a pair of Neel magnetic domain walls are generated at both of a local magnetization-inverted magnetic domain and the magnetization-switched magnetic domain. The write in-plane current applied to the input branch is synchronized with the gate voltage and locally provides, to a magnetic domain initially magnetized to a first state, by magnetic anisotropy reduced by the gate voltage.

A pair of magnetic domain walls are chiral magnetic domain walls generated by antisymmetric exchange. A pair of magnetic domain walls are Neel magnetic domain walls. As a pair of magnetic domain walls are simultaneously shifted in a predetermined direction by an in-plane shift current, the written information is shifted. Accordingly, information written in each of the input branches is shifted to the in-plane shift current and is shifted toward the coupling portion. Information collected in the coupling portion is logically computed by the coupling portion. The logically computed information is shifted to the output branch. A magnetic tunnel junction device disposed on the output branch detects shifting information.

According to an exemplary embodiment of the present invention, a logic device performs a different logic operation according to an initial magnetization state of the free layer. The initial magnetization state of the free layer may be changed through a predetermined operation. Accordingly, various logic operations may be performed in the same device.

According to an exemplary embodiment of the present invention, the logic device may provide a rapid switching operation with a low write in-plane current by providing faster magnetization inversion than a spin transfer torque by using a spin orbit torque. Further, since a magnetic tunnel junction is not used in an information write operation, damage to a tunnel insulating layer is prevented, thereby increasing information write reliability.

According to an exemplary embodiment of the present invention, the logic device may perform a rapid computation operation by providing a high shift speed by using the spin orbit torque.

Hereinafter, the present invention will be described in detail with reference to the accompanying drawings. Hereinafter, the present invention will be described in more detail with reference to preferred embodiments. However, the embodiments are used for more specifically describing the present invention and it will be apparent to those skilled in the art that the present invention is not restricted or limited by an experimental condition, a material type, etc. The present invention is not limited to exemplary embodiments described herein and may be embodied in other forms. Rather, the embodiments introduced herein are provided so that the disclosure may be made thorough and complete, and so that the spirit of the invention is fully conveyed to those skilled in the art. In the drawings, the components are exaggerated for clarity. Through the specification, like reference numerals represent like elements.

FIG. 1A is a perspective view illustrating a magnetic logic device according to an exemplary embodiment of the present invention.

Figure 1B:
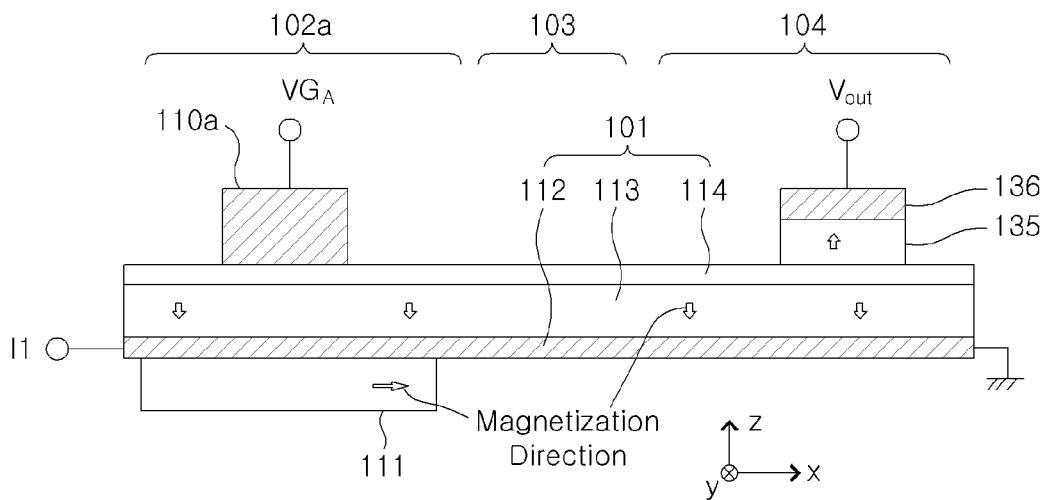
FIG. 1B is a cross-sectional view taken along line A-A' of FIG. 1A.

FIG. 1B is a cross-sectional view taken along line A-A' of FIG. 1A.

Figure 2A:
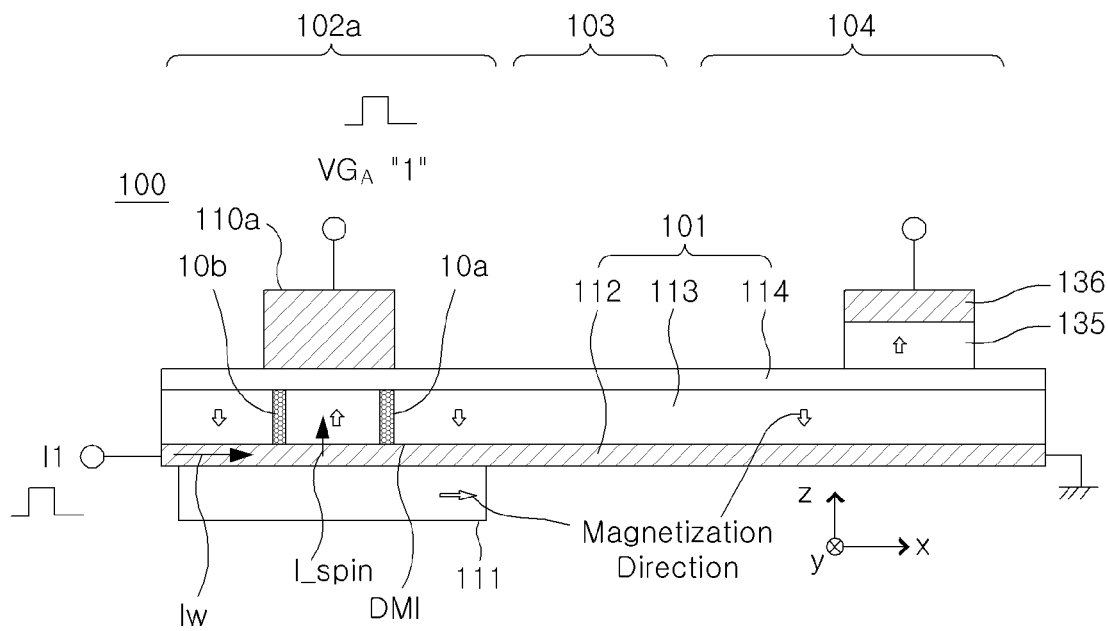
FIG. 2A is a cross-sectional view for describing an information write operation in the magnetic logic device of FIG. 1A.

FIG. 2A is a cross-sectional view for describing an information write operation in the magnetic logic device of FIG. 1A.

Figure 2B:
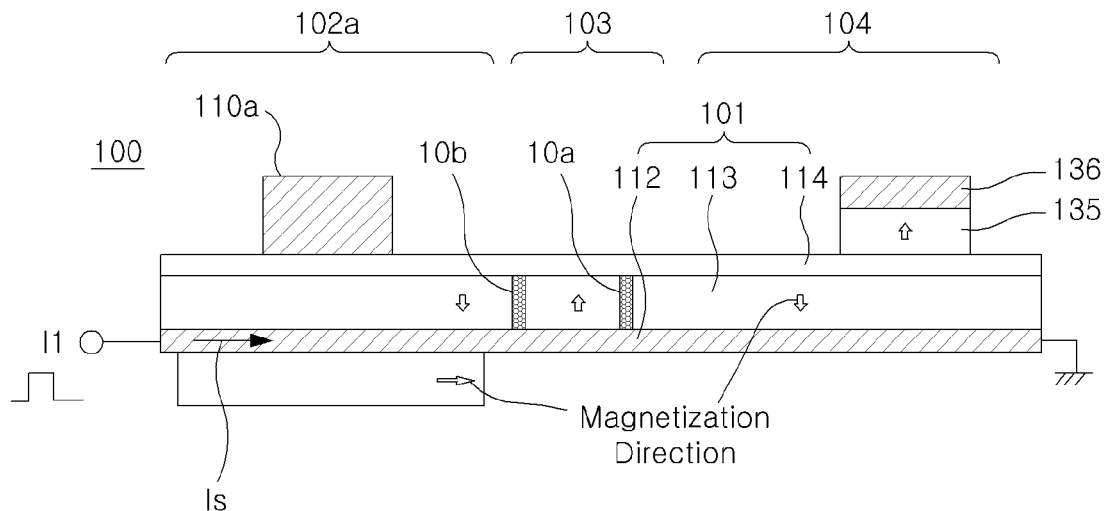
FIG. 2B is a cross-sectional view for describing information shifting and computation operations in the magnetic logic device of FIG. 1A.

FIG. 2B is a cross-sectional view for describing information shifting and computation operations in the magnetic logic device of FIG. 1A.

Figure 2C:
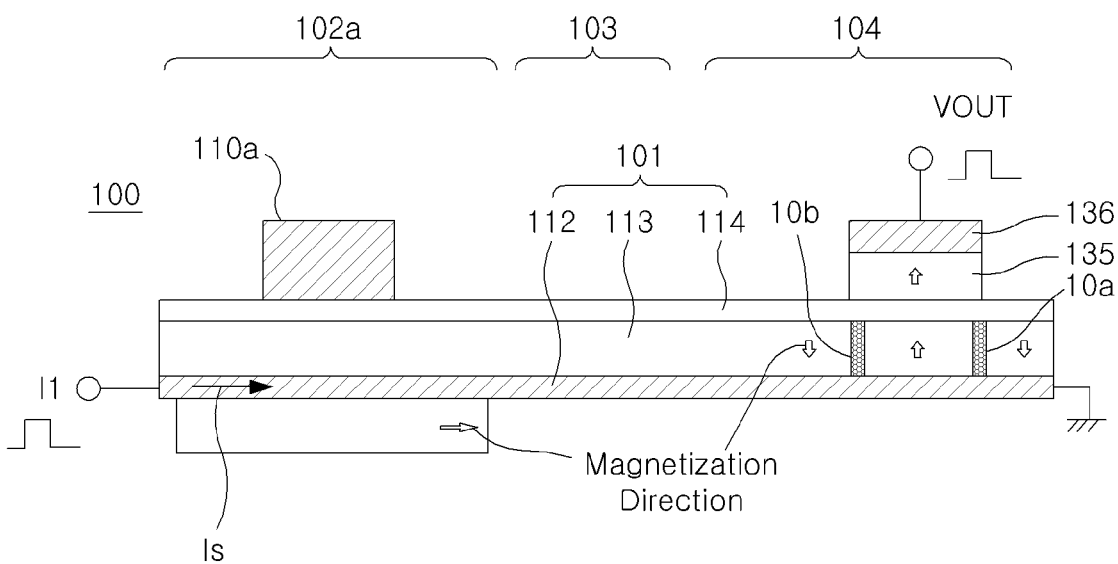
FIG. 2C is a cross-sectional view for describing an information detection operation in the magnetic logic device of FIG. 1A.

FIG. 2C is a cross-sectional view for describing an information detection operation in the magnetic logic device of FIG. 1A.

Figure 3A:
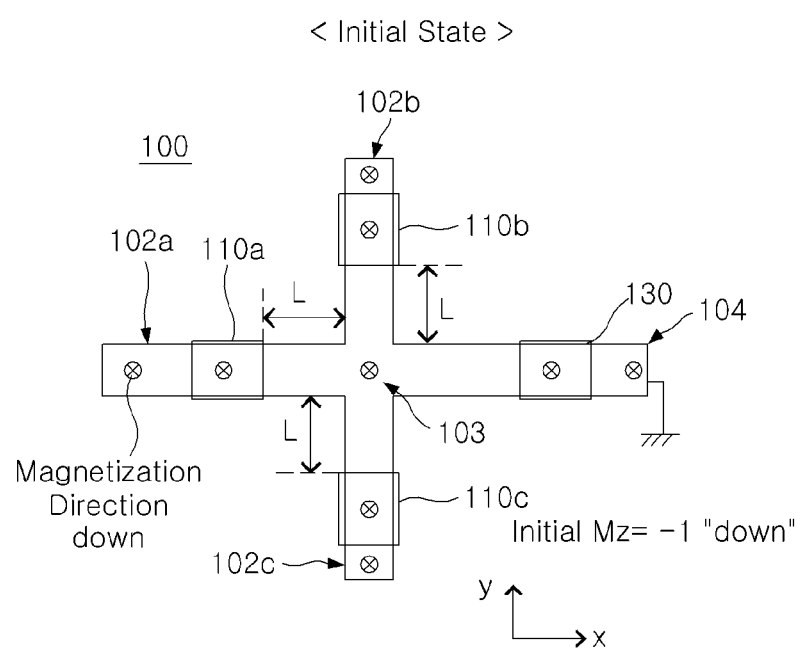
FIG. 3A is a plan view for describing an initial state in the magnetic logic device of FIG. 1A.

FIG. 3A is a plan view for describing an initial state in the magnetic logic device of FIG. 1A.

Figure 3B:
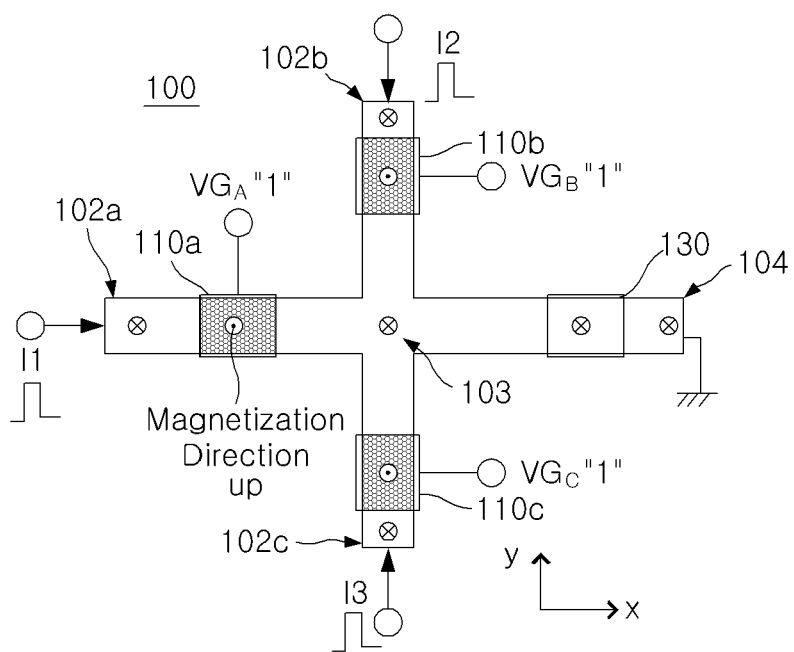
FIG. 3B is a plan view for describing the information write operation in the magnetic logic device of FIG. 1A.

FIG. 3B is a plan view for describing the information write operation in the magnetic logic device of FIG. 1A.

Figure 3C:
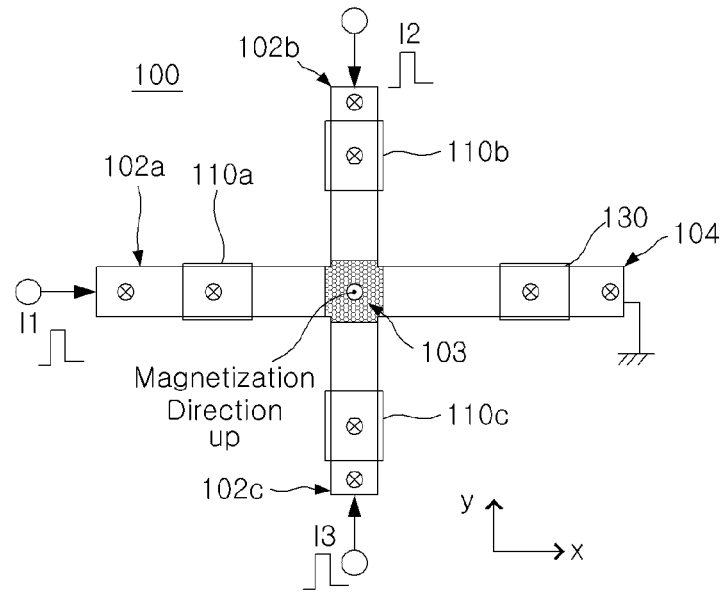
FIG. 3C is a plan view for describing the information shifting and computation operations in the magnetic logic device of FIG. 1A.

FIG. 3C is a plan view for describing information shifting and computation operations in the magnetic logic device of FIG. 1A.

Figure 3D:
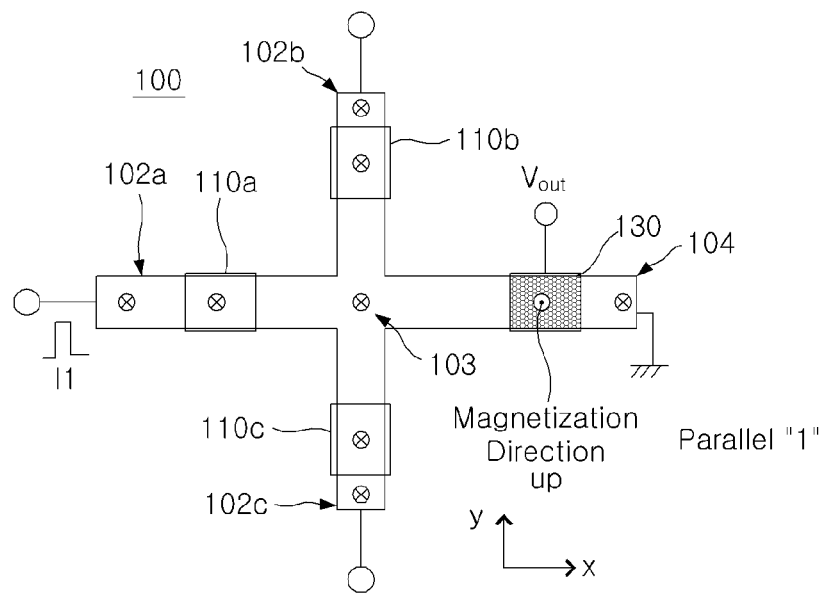
FIG. 3D is a plan view for describing the information detection operation in the magnetic logic device of FIG. 1A.

FIG. 3D is a plan view for describing the information detection operation in the magnetic logic device of FIG. 1A.

Figure 4:
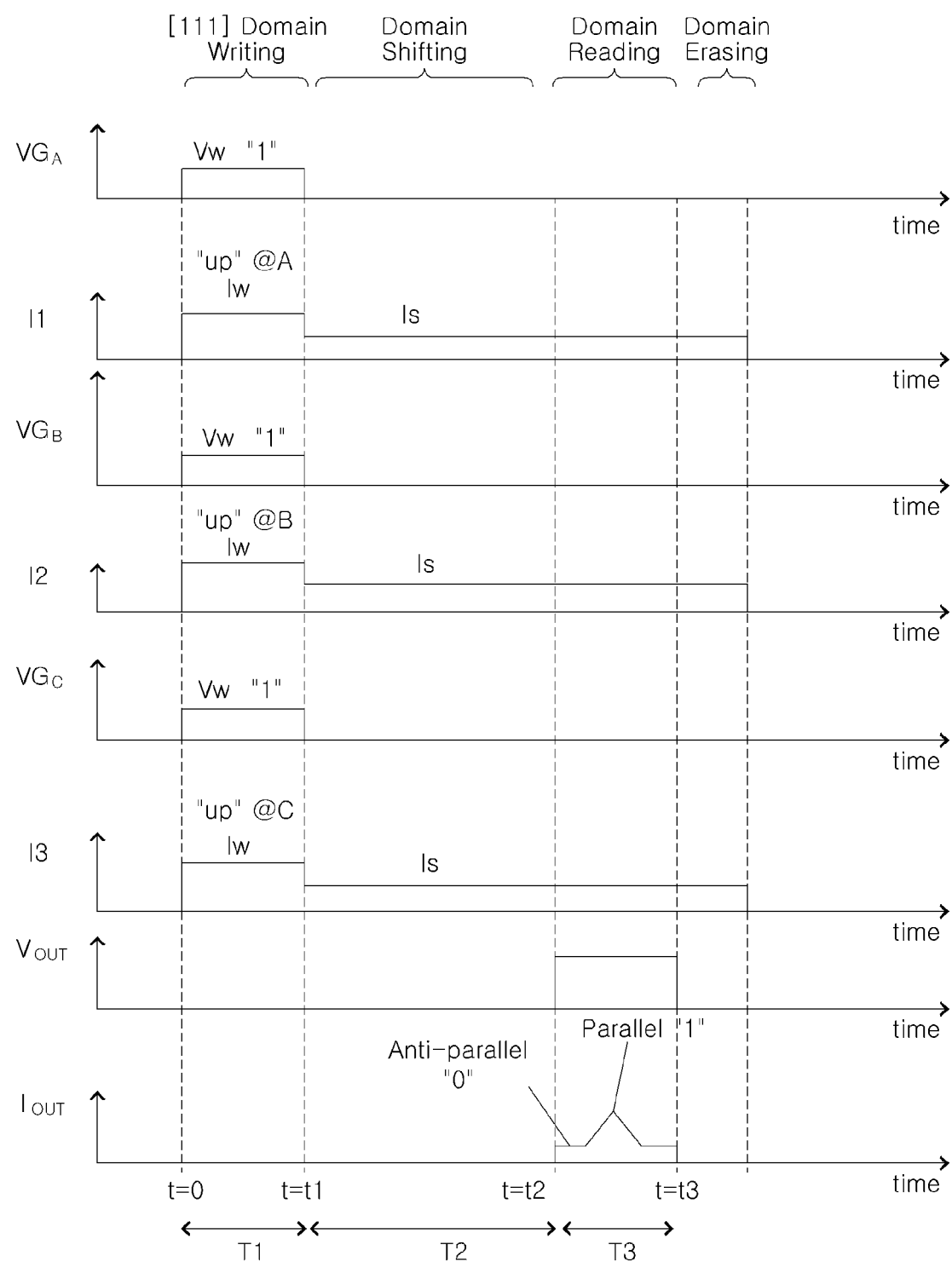
FIG. 4 is a timing diagram illustrating [111] signal computation of the magnetic logic device of FIG. 1A.

FIG. 4 is a timing diagram illustrating [111] signal computation of the magnetic logic device of FIG. 1A.

FIG. 5 illustrates a logic operation result of the magnetic logic device of FIG. 1A.

Referring to FIGS. 1 to 5, the magnetic logic device 100 includes: a plurality of input branches 102a, 102b, and 102c configured by a magnetic nanowire 101 including a non-magnetic metallic layer 112, a free layer 113, and an insulating layer 114 sequentially stacked; an output branch 104 configured by the magnetic nanowire 101; a coupling portion 103 configured by the magnetic nanowire 101 and where the input branches 102a, 102b, and 102c, and the output branch 104 meet; gate electrodes 110a, 110b, and 110c arranged adjacent to the insulating layer 114 in each of the plurality of input branches 102a, 102b, and 102c; and in-plane anisotropic ferromagnetic layers 111 arranged adjacent to the non-magnetic metallic layer 112 in each of the plurality of input branches 102a, 120b, and 102c. A gate voltage (VG) applied to the gate electrodes 110a, 110b, and 110c reduces the perpendicular magnetic anisotropy of the free layer 113. The free layer 113 has the perpendicular magnetic anisotropy. A write in-plane current (Iw) applied to the input branches 102a, 102b, and 102c is synchronized with the gate voltage (VG), and locally provides, to the magnetic domain initially magnetized to the first state, magnetization inversion by the perpendicular magnetic anisotropy reduced by the gate voltage (VG). A pair of magnetic domain walls formed by the magnetization inversion are Neel magnetic domain walls 10a and 10b.

The number of input branches 102a, 102b, and 102c may be three, and the input branches 102a, 102b, and 102c and the output branches 104 may be arranged in a cross form. Lengths of input branches 102a, 102b, and 102c may be the same as each other. The output branches 104 may be grounded. The in-plane current flowing through the first input branch 102a is I1 and the in-plane current flowing through the second input branch 102b is I2, and the in-plane current flowing through the third input branch 102c is I3. The voltage of a first gate electrode 110a is VGA, the voltage of a second gate electrode 110b is $VG_B$, and the voltage of a third gate electrode 110c is $VG_c$. The gate voltage VG may apply a positive gate write voltage Vw while performing a write operation. The in-plane current may be a shift in-plane current Iw applied during the write operation or a shift in-plane current Is applied during a shifting operation.

The non-magnetic metallic layer 112 may be a material that provides a spin hall effect. The non-magnetic metallic layer may include at least one of platinum, tungsten, and tantalum.

The free layer 113 may be a ferromagnetic body having the perpendicular magnetic anisotropy. The free layer may be CoFeB.

The insulating layer 114 may insulate the gate electrodes 110a, 110b, and 110c, and provide a tunnel insulating layer of a detection device 130. The insulating layer 114 may be MgO.

The input branches 102a, 102b, and 102c and the output branch 104 may be arranged in the cross shape, and the coupling portion 103 may be a portion where the input branches 102a, 102b, and 102c and the output branch 104 cross.

The gate electrodes 110a, 110b, and 110c may include at least one of Ru, Ta, Cu, or Al. The gate electrodes 110a, 110b, and 110c may be a multi-layered structure.

The magnetic logic device 100 includes an operation of receiving information from the outside and writing information on the input branches 102a, 102b, and 102c, an operation of performing a logic operation while shifting the written information, and an operation of shifting the logically computed information and detecting the information.

A magnetization inversion operation or a write operation by a spin orbit torque may be performed by the write in-plane current Iw applied to the non-magnetic metallic layer 112 of the input branches 102a, 102b, and 102c.

Further, a voltage-controlled magnetic anisotropy effect is used for [111] information writing. That is, in a state in which the gate electrodes 110a, 110b, and 110c arranged in the input branches 102a, 120b, and 102c for information writing provide the voltage-controlled magnetic anisotropy effect to the free layer 113, the write in-plane current Iw flows on the non-magnetic metallic layer 112 of the input branches 102a, 102b, and 102c. The write in-plane current Iw which flows on the non-magnetic metallic layer 112 forms a spin current I_spin perpendicular to a thin film. The spin current (or spin hall current) is generated by the free layer 113 by a spin hall effect or a Rashiba effect in an adjacent non-magnetic metallic layer 112. The pin current (or spin hall current) may be injected into the free layer 113. The spin current (or spin hall current) may locally switch magnetization of the free layer 113 in a voltage-controlled magnetic anisotropy domain by the spin orbit torque. Magnetization switching or magnetization inversion forms a pair of Neel magnetic domain walls 10a and 10b around.

In general, an in-plane external magnetic field is required for the spin orbit torque to perform the magnetization inversion in a specific direction. In order to locally switch the magnetic domain in a specific direction, an in-plane magnetic anisotropy ferromagnetic layer 111 may provide ferromagnetic interaction (or exchange bias magnetic field) to the free layer 113 having perpendicular magnetic anisotropy ferromagnetism. Further, the in-plane magnetic anisotropy ferromagnetic layer 111 may provide a stray magnetic field or a leakage magnetic field to the free layer 113 having the perpendicular magnetic anisotropy ferromagnetism. As a result, a spin current I_spin induced by the write in-plane current Iw may provide deterministic switching to a domain (or a gate electrode domain) having magnetic anisotropy reduced by the gate electrode. The exchange bias magnetic field or stray magnetic field may replace a role of an external in-plane magnetic field for deterministic switching. The exchange bias magnetic field or stray magnetic field may be formed by an in-plane magnetic anisotropy ferromagnetic layer 111 or an anti-ferromagnetic layer having in-plane magnetic anisotropy/an in-plane magnetic anisotropic ferromagnetic layer. The in-plane magnetic anisotropic ferromagnetic layer 111 may be CoFe or CoFeB.

A spin orbit torque $\tau_{SOT}$ for switching of magnetization is shown by the following equation.

$$\vec{\tau}_{SOT} = \tau_0 (\hat{m} \times \hat{\sigma} \times \hat{m}) = \frac{\hbar \theta_{SH}}{2eM_S t} J(\hat{m} \times \hat{\sigma} \times \hat{m}) \quad \text{[Equation 1]}$$

Here, a size of saturation magnetization of the magnetic layer or the free layer 113 is $M_s$, a direction of magnetization is $\hat{m}$, and a thickness of the free layer 113 is t. When an in-plane current flows, a size (or spin hall angle) of efficiency in which the spin current I_spin is generated by the spin hall effect or Rashiba effect in the non-magnetic metallic layer 112 is $\theta_{SH}$. An in-plane current density which flows on the non-magnetic metallic layer 112 is J. A spin moment direction of the spin current I_spin is $\hat{\sigma}$. $\tau_0$ corresponds to $$\frac{\hbar \theta_{SH}}{2eM_S t}, \quad \hbar = \frac{h}{2\pi}$$

and h represents a Planck constant.

Exemplarily, the direction $\hat{m}$ of the magnetization is a +z direction and the direction $\hat{\sigma}$ of the spin moment of an incident spin current I_spin is a +y direction. In this case, the direction of the spin orbit torque $\tau_{SOT}$ described as [Equation 1] is the +y direction. Accordingly, the magnetization may not be switched from the +z direction to a −z direction only by the spin orbit torque. In order to solve this, an in-plane bias magnetic field $\vec{B}_x$ is required in a +x direction. A torque $\tau_H$ by the in-plane bias magnetic field $\vec{B}_x$ is given as follows.

$$\tau_H = -\hat{m} \times \vec{B}_x \quad \text{[Equation 2]}$$

Here, when the direction $\hat{m}$ of the magnetization is the +y direction, the direction of the torque $\tau_H$ by the in-plane bias magnetic field $\vec{B}_x$ is the +z direction.

When the direction $\hat{m}$ of the magnetization is the −y direction, the direction of the torque $\tau_H$ by the in-plane bias magnetic field $\vec{B}_x$ is the −z direction. Accordingly, selective switching is possible.

The direction of magnetization switching is adjusted by the spin moment direction $\hat{\sigma}$ of the spin current and the direction of the in-plane bias magnetic field $\vec{B}_x$. Accordingly, by applying a material which a sign of the spin hall effect is opposite or the in-plane bias magnetic field $\hat{B}_x$ oppositely, switching may be selectively adjusted.

According to an exemplary embodiment of the present invention, in a state in which the direction of the in-plane bias magnetic field $\hat{B}_x$ is fixed, the direction of the injected write in-plane current Iw is changed to change the spin moment direction $\hat{\sigma}$ of the spin current, thereby switching the direction $\hat{m}$ of the magnetization from "up" to "down or from "down" to "up".

In order to cause the magnetization switching, the spin orbit torque should overcome the magnetic anisotropy of the free layer 113. Accordingly, an energy barrier of magnetization switching is determined by the magnetic anisotropy of the free layer 113. That is, when the magnetic anisotropy of the free layer 113 is adjusted, a condition in which the magnetization switching is performed may be satisfied.

According to an exemplary embodiment of the present invention, the magnetic anisotropy of the free layer 113 may be locally lowered through the gate voltage VG. As a result, the magnetization switching by the spin orbit torque is locally expressed. As a result, local magnetization inversion and a pair of Neel magnetic domain walls are generated.

The magnetization switching occurs when a torque acquired by adding the spin orbit torque $\tau_{SOT}$ by spin injection and the spin orbit torque $\tau_H$ by the in-plane magnetic field exceeds the magnetic anisotropy of the free layer 113. Therefore, the size of the in-plane current (or the in-plane current density J) and/or the in-plane bias magnetic field $\vec{B}_x$ for the magnetization switching depends on the size of the magnetic anisotropy which may be controlled by the gate voltage. That is, if the magnetic anisotropy may be significantly reduced, the size of the switching current and/or the in-plane magnetic field is reduced.

According to a simulation of the present invention, a situation is assumed in which the magnetic anisotropy is locally reduced by 12% by the gate voltage VG. In the case of the in-plane bias magnetic field $\vec{B}_x$, switch occurs in an in-plane current density $J=8.5\times10^{11}$ A/m$^{-2}$ in a situation in which 0.1 Tesla is present. When the in-plane magnetic field or the in-plane current density may be increased or decreased according to a magnetic anisotropy adjustment value by the same gate voltage.

For an operation of performing the logic operation while shifting written information, the written information may be shifted in a specific direction by the shift in-plane current Is. The written information is distinguished by a magnetic domain and a pair of magnetic domain walls arranged at both sides of the magnetic domain.

Current-induced domain wall motion (CIDWM) is described by a spin transfer torque theory in a state in which the non-magnetic metallic layer is removed in the related art.

According to the present invention, the current-induced domain wall motion (CIDWM) is described by antisymmetric interaction or DzyaloshinskiiMoriya interaction (DMI) and a spin orbit torque theory in a magnetic nanowire having the non-magnetic metallic layer/ferromagnetic layer.

For shifting of a pair of magnetic domain walls 10a and 10b to the nanowire 101 having the non-magnetic metallic layer/free layer/insulating layer, the shift in-plane current Is which flows on the non-magnetic metallic layer 112 forms the spin current I_spin perpendicular to the thin film. The spin current (or spin hall current) is generated in the free layer 113 by the spin hall effect or Rashiba effect in the adjacent non-magnetic metallic layer 112. The pin current (or spin hall current) may be injected into the free layer 113. The spin current shifts a pair of magnetic domain walls 10a and 10b rapidly in the same direction without an external magnetic field by the spin orbit torque.

Shift speeds of the magnetic domain walls 10a and 10b by the spin orbit torque may be higher than a shift speed of the magnetic domain wall by a spin transfer torque by a charge current which flows only on the free layer in the related art.

When the shift in-plane current Is flows on the non-magnetic metallic layer 112, a phenomenon occurs in which a pair of magnetic domain walls 10a and 10b of the free layer are shifted in one direction by a spin torque phenomenon. The size of the shift in-plane current Is is smaller than the write in-plane current Iw.

Specifically, shifting of the magnetic domain walls 10a and 10b by the spin orbit torque will be described. It is assumed that the magnetic nanowire 101 extends in an x direction and the shift in-plane current Is flows in the +x direction. When the free layer 113 has the perpendicular magnetic anisotropy, the one pair of magnetic domain walls 10a and 10b are formed on a boundary of up (+magnetization direction) and down (−z magnetization direction). The magnetization in the free layer 113 is continuously changed even in the magnetic domain walls 10a and 10b. A direction in which the magnetization may have at the center of the magnetic domain walls 10a and 10b becomes in the in-plane direction (y direction or x direction). In this case, when the direction of the one pair of magnetic domain walls 10a and 10b is the +y or −y direction, a Bloch domain wall is formed. Meanwhile, when the direction of the one pair of magnetic domain walls 10a and 10b is the +x or −x direction, a Neel domain wall is formed.

When the shift in-plane current Is flows on a non-magnetic metallic layer/free layer structure in the +x direction, a y-direction spin moment is injected into the free layer 113 due to the spin hall effect or Rashiba effect. In this case, the direction of the spin moment may be the +y direction or −y direction according to a spin hall sign. The spin hall sign is determined by the type of non-magnetic metallic layer 112. For example, in the case of platinum (Pt), the direction of the spin moment is the −y direction. In the case of tantalum (Ta), the direction of the spin moment is the +y direction. In this case, the spin orbit torque generated in the free layer 113 may be given as [Equation 1].

The direction of the magnetization of one pair of magnetic domain walls 10a and 10b is the in-plane direction. Accordingly, the direction $\hat{m}$ of the magnetization of the magnetic domain wall may be the x direction or y direction. The direction $\hat{\sigma}$ of the spin moment injected by the spin hall effect (or Rashiba effect) is the y direction. When the magnetization direction $\hat{m}$ of one pair of magnetic domain walls is the y direction (i.e., when the magnetic domain wall is the Bloch domain wall), the spin orbit torque $\tau_{SOT}$ becomes zero. Therefore, the Bloch magnetic domain wall may not be shifted by the spin orbit torque $T_SOT$.

In order to shift the magnetic domain walls 10a and 10b by the spin orbit torque $\tau_{SOT}$, the magnetic domain walls 10a and 10b should be particularly the Neel magnetic domain wall. The direction of the spin orbit torque $\tau_{SOT}$ is determined according to the direction $\hat{\sigma}$ of the spin moment and the direction (+x or −x) of the Neel magnetic domain wall.

In order to calculate a shift mechanism and a speed of the Neel magnetic domain wall, [Equation 1] of the spin orbit torque $\tau_{SOT}$ may be given as follows.

$$\vec{\tau}_{SOT} = \tau_0(\hat{m} \times \hat{\sigma} \times \hat{m}) = -\hat{m} \times \vec{H}_{eff} \quad \text{[Equation 3]}$$

Here, $\vec{H}_{eff} = \tau_0 \hat{m} \times \hat{\sigma}$ is an effective magnetic field by the spin orbit torque. That is, a spin in which the direction $\hat{\sigma}$ of the spin moment is +y is injected by the spin hall effect and when the direction $\hat{m}$ of the Neel magnetic domain wall is the +x direction, a +z-direction effective magnetic field $H_{eff}$ is applied. Therefore, since the +z-direction effective magnetic field $H_{eff}$ extends an up magnetization domain, an up-down magnetic domain wall is shifted in a direction in which "up" extends.

The size of the effective magnetic field $H_{eff}$ considering the spin hall effect or magnetization in the material is given as follows.

$$H_{eff} = \frac{\hbar \theta_{SH}}{2\mu_0 e M_S t} J \quad \text{[Equation 4]}$$

Here, $\mu_0$ represents a magnetic permeability. In this case, the speed of the magnetic domain wall is as follows.

$$v = \frac{\gamma \lambda \hbar \theta_{SH}}{2\alpha \mu_0 e M_S t} J \quad \text{[Equation 5]}$$

Here, $\gamma$ represents a gyromagnetic ratio, $\lambda$ represents a width of the magnetic domain wall, and $\alpha$ represents a magnetic attenuation constant. Although there is a difference depending on the characteristics of the material, the speed of the common magnetic domain wall is 100 m/s or more.

When a material having a large spin hall effect is used, a spin hall angle $\theta_{SH}$ may increase. Therefore, the spin orbit torque has higher efficiency and provides a higher shift speed than the spin transfer torque. When the magnetic layer is determined, the efficiency of the spin transfer torque is determined. Meanwhile, the efficiency of the spin orbit torque varies depending on the non-magnetic layer, and as a result, the magnetic domain wall shift speed of the magnetic layer varies depending on selection of the non-magnetic layer.

According to an exemplary embodiment of the present invention, values reported in an actual material are used, such as $M_S$=560×10^3 A/m, $\alpha$=0.6, $\theta_{SH}$=0.1, etc. In the in-plane current density J=1.58×10^11 A/m^2, the speed of the magnetic domain wall may be 100 m/s. This speed value may be increased by increasing the in-plane current density or increasing the spin hall effect.

In order for one pair of magnetic domain walls 10a and 10b to be shifted in the same direction, a chiral Neel magnetic domain wall should be particularly formed. The chiral Neel magnetic domain wall means a case where magnetization of a magnetic body is twisted in a predetermined direction and a magnetization direction of an adjacent Neel magnetic domain wall becomes opposite. For example, one pair of adjacent magnetic domain walls should be an up-left-down magnetic domain wall and a down-right-up magnetic domain wall. This may be achieved by the anti-symmetric interaction (DMI (DzyaloshinskiiMoriya interaction)). The DzyaloshinskiiMoriya interaction (DMI) is a phenomenon which occurs at an interface of the magnetic layer and the non-magnetic layer. The Dzyaloshinskii-Moriya interaction (DMI) serves as a chiral that makes the magnetization of the magnetic layer be twisted in a specific direction.

A DzyaloshinskiiMoriya interaction energy $E_{DMI}$ is given as follows.

$$E_{DMI} = -D(\vec{S}_i \times \vec{S}_j) \quad \text{[Equation 6]}$$

Here, D represents a DMI coefficient, and $S_i$ and $S_j$ represent neighboring magnetic spins. When directions of two adjacent magnetization spins are not parallel to each other, the DzyaloshinskiiMoriya interaction energy becomes more stable. Further, $S_i$ and $S_j$ are twisted in a direction to lower the energy. This works in a situation in which the magnetization is spatially changed like the magnetic domain wall.

In a situation where the DMI is present, the change of the magnetization depends on the size of the DMI. The size of the DMI is generally indicated by the effective magnetic field. The size of the effective magnetic field $H_{DMI}$ by the DMI is given as follows.

$$H_{DMI} = \frac{D}{\mu_0 M_S \lambda} \quad \text{[Equation 7]}$$

D represents a DMI coefficient which depends on the material, Ms represents the saturation magnetization, and $\lambda$ represents the width of the magnetic domain wall. When the DMI is present, the effective magnetic field $H_{DMI}$ is applied to the magnetic domain wall. The effective magnetic field stabilizes the Neel magnetic domain wall.

The Neel magnetic domain wall is required for the magnetic domain walls 10a and 10b to be shifted by the spin orbit torque $\tau_{SOT}$. The DMI is required to form the Neel magnetic domain wall and shift one pair of magnetic domain walls in the same direction.

According to an exemplary embodiment of the present invention, D=0.5 mJ/m^2 reported in a Pt/Co structure is used.

Due to another effect by the DMI, the magnetization in the magnetic domain wall rotates in a specific direction. For example, in the magnetic domain wall, a left side is in an up state and a right side is in a down state. In the magnetic domain wall, the magnetization particularly rotates in a predetermined direction. For example, if it is stable that the magnetization rotates counterclockwise while proceeding to the right, it is unstable that the magnetization rotates clockwise. The DMI provides the chiral magnetic domain wall.

Which direction of a clockwise direction or a counterclockwise direction becomes stable varies depending on the material. Specifically, which direction of the clockwise direction or the counterclockwise direction becomes stable varies depending on which material is used for the magnetic layer and the non-magnetic layer. For example, in the case of Pt/CoFeB, the counterclockwise direction is stable and in the case of W/CoFeB, the clockwise direction is stable.

In the case of chiral magnetic domain wall characteristics, one pair of magnetic domain walls are shifted in the same direction by the shift in-plane current. The effective magnetic field $H_{eff}$ which the spin orbit torque $\tau_{SOT}$ exerts to one pair of magnetic domain walls 10a and 10b is given as in [Equation 3]. In this case, the effective magnetic field is determined according to the magnetization direction of the magnetic domain wall.

One pair of magnetic domain walls are present. In this case, the magnetization will be changed to [up—first Neel magnetic domain wall—down—second Neel magnetic domain wall—up]. In order for the first Neel magnetic domain wall and the second Neel magnetic domain wall to be simultaneously shifted to the right by the in-plane current, an up-direction effective magnetic field is required for the first Neel magnetic domain wall and a down-direction effective magnetic field is required for the second Neel magnetic domain wall.

Therefore, the effective magnetic fields applied to the first and second Neel magnetic domain walls should be opposite to each other. To this end, the magnetization directions of the first and second Neel magnetic domain walls should be opposite to each other. For example, the magnetization should be changed like up-right-down-left-up or up-left-down-right-up. The chiral magnetic domain wall by the DMI satisfies a condition in which the magnetization rotates in a predetermined direction.

Consequently, only if the DMI is present, one pair of magnetic domain walls are shifted in the same direction by the spin orbit torque. In this case, the shift direction is determined by the direction of the spin incident by the spin hall effect or the direction of the Neel magnetic domain wall determined by the DMI, and this is adjustable through material selection.

The antisymmetric interaction coupling or Dzyaloshinskii Moriya interaction (DMI) may occur by an interface effect between the non-magnetic metallic layer and the perpendicular magnetic anisotropic ferromagnetic layer. Specifically, when the non-magnetic metallic layer is platinum (Pt) and the perpendicular magnetic anisotropic ferromagnetic layer is CoFeB, magnetization inversion (write operation) by the spin orbit torque and a magnetic domain wall shifting operation (logic computing operation) by the spin orbit torque may be performed.

The operating method of the magnetic logic device includes: writing information by performing magnetization inversion of the free layer 113 by applying the write in-plane current Iw to the non-magnetic metallic layer 112 of the input branches 102a, 102b, and 102c while applying the gate voltage VG to each of the gate electrodes 110a, 110b, and 110c to correspond to information provided from the outside; performing the logic operation in the coupling portion 103 while shifting the written information by applying the shift in-plane current Is to the non-magnetic metallic layer 112 of the input branches 102a, 102b, and 102c; and detecting information logically computed by the shift in-plane current of the non-magnetic metallic layer 112 through a magnetic tunnel junction structure by shifting the information to the output branch 104. The operating method of the magnetic logic device may further include changing an initial magnetization state of the magnetic nanowire 101.

In the writing of the information, the gate voltage may be applied to the gate electrodes 110a, 110b, and 110c according to the written information and the write in-plane current Iw may be applied to the input branches 102a, 102b, and 102c. One end of the output branch 104 may be grounded.

For example, in the initial state, the input branches 102a, 102b, and 102c, the coupling portion 103, and the output branch 104 may all be in the "down" state.

When the written information is [111], the "up" may be written in the first input branch 102a, the "up" may be written in the second input branch 102b, and the "up" may be written in the third input branch 102c.

Specifically, a first write in-plane current Iw is applied to the first input branch 102a and a first gate write voltage $V_w$ is applied to the first gate electrode 110a in a pulse form during a write interval T1. As a result, the first input branch 102a locally performs the magnetization inversion in the free layer 113 corresponding to the first gate electrode.

A second write in-plane current Iw is applied to the second input branch 102a and a second gate write voltage $V_w$ is applied to the second gate electrode during the write interval T1. As a result, the second input branch locally performs the magnetization inversion in the free layer 113 corresponding to the second gate electrode.

A third write in-plane current Iw is applied to the third input branch 102c and a third gate write voltage $V_w$ is applied to the third gate electrode during the write interval T1. As a result, the third input branch locally performs the magnetization inversion in the free layer 113 corresponding to the third gate electrode.

A principle in which a majority gate having three input branches 102a, 102b, and 102c, and one output branch 104 operates is described. The magnetic domain walls may proceed to the coupling portion 103 from each input branch by the shift in-plane current of the corresponding input branch. Each magnetic domain wall simultaneously meets at the coupling portion 103. Further, three in-plane currents meet at the coupling portion 103. The magnetic domain wall is shifted by such a current flow.

For example, a second in-plane current which flows along the second branch 102b flows in a −y-axis direction and a third in-plane current which flows along the third branch 102c flows in a +y-axis direction. Accordingly, a y-direction current component becomes 0 at the coupling portion. Meanwhile, a first in-plane current which flows along the first branch 102a flows in a +x-axis direction and a current of the output branch 104 is the sum of currents of three input branches.

When the magnetic domain wall reaches the coupling portion 103, a domain where the magnetic domain wall extends is determined by the number of magnetic domain wall inputs. When the number of magnetic domain wall inputs is 1, a first magnetic domain wall extends only a narrow domain of the coupling portion and does not proceed any longer. Thus, a subsequent second magnetic domain wall meets the first magnetic domain wall, and as a result, a magnetic domain storing information is extinct.

When the number of magnetic domain wall inputs is 2 or more, first magnetic domain walls 10a which proceed in different input branches are connected to each other at the coupling portion 103 to secure a wide area. Further, subsequent second magnetic domain walls 10b are also connected to each other. The coupled magnetic domain wall proceeds to the output branch 104 by the in-plane current.

In the performing of the logic operation at the coupling portion 103 while shifting the written information, the shift in-plane current Is is applied to each of the input branches in which the information is written. That is, in a state in which the information is written by the magnetization inversion at the first input branch 102a, the shift in-plane current Is is continuously performed in the write in-plane current Iw during a second time interval T2. As a result, the information stored in each of the input branches 102a, 102b, and 102c is shifted to the coupling portion 103 and then is computed, and shifted to the output branch 104.

When the magnetic nanowire 101 is initially initialized to a "down" state (Mz=−1), and up to one of the information inputted into three input branches 102a, 102b, and 102c is in an "up" state (Mz=+1), the output branch 104 outputs the "down" state (Mz=−1). Here, the "down" state indicates logic "0" and the "up" state indicates logic "1". Meanwhile, when two or more of the information inputted into three input branches 102a, 102b, and 102c are in the "up" state (Mz=+1), the output branch 104 outputs the "up" state (Mz=+1). The magnetic logic device performs AND and OR operations.

An operation of shifting and detecting the logically computed information may be performed by the detection device 130 disposed in the output branch 104. The detection device 130 that detects the magnetization state of the magnetic domain may be disposed in the output branch 104. The detection device 130 may be a magnetic resistance device. Preferably, the detection device 130 may be a magnetic tunnel junction device. The detection device 130 may detect the logically computed magnetic domain which is shifted along the output branch by the shift in-plane current Is. The magnetic domain wall which reaches the end of the output branch 104 may be extinct.

The detection device 130 may include the non-magnetic conductive layer 112, the free layer 113, the insulating layer 114, a fixation layer 135, and an electrode layer 136 which are stacked in sequence. The fixation layer 135 is disposed adjacent to the insulating layer 114 in the output branch 104. The free layer 113, the insulating layer 114, and the fixation layer 135 may provide magnetic tunnel junction. The electrode layer 136 is connected to an external detection circuit to apply a detection voltage. The external detection circuit may detect a magnetic resistance by using a tunnel current. The magnetic tunnel junction or the detection device 130 may detect the computation result of the information. When magnetization of the fixation layer 135 and magnetization of the free layer 113 are parallel to each other, the magnetic resistance is low. Meanwhile, when magnetization of the fixation layer 135 and magnetization of the free layer 113 are anti-parallel to each other, the magnetic resistance is high.

Figure 6A:
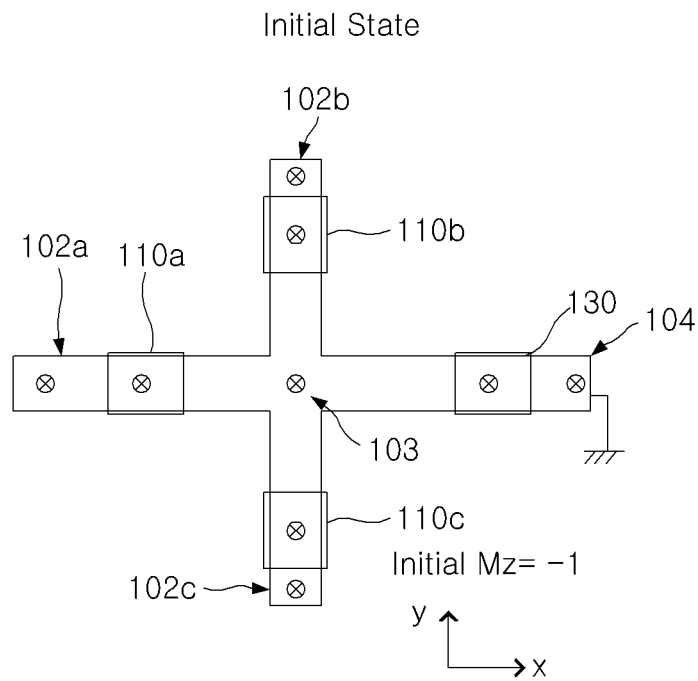
FIG. 6A is a plan view for describing an initial state in the magnetic logic device for a logic operation of [100].

FIG. 6A is a plan view for describing an initial state in the magnetic logic device for a logic operation of [100].

Figure 6B:
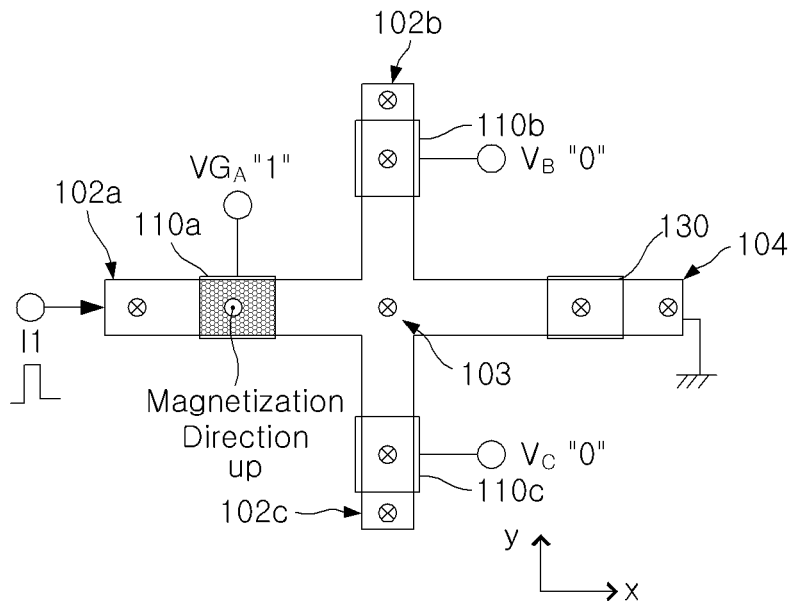
FIG. 6B is a plan view for describing the information write operation in the magnetic logic device for the logic operation of [100].

FIG. 6B is a plan view for describing the information write operation in the magnetic logic device of the logic operation of [100].

Figure 6C:
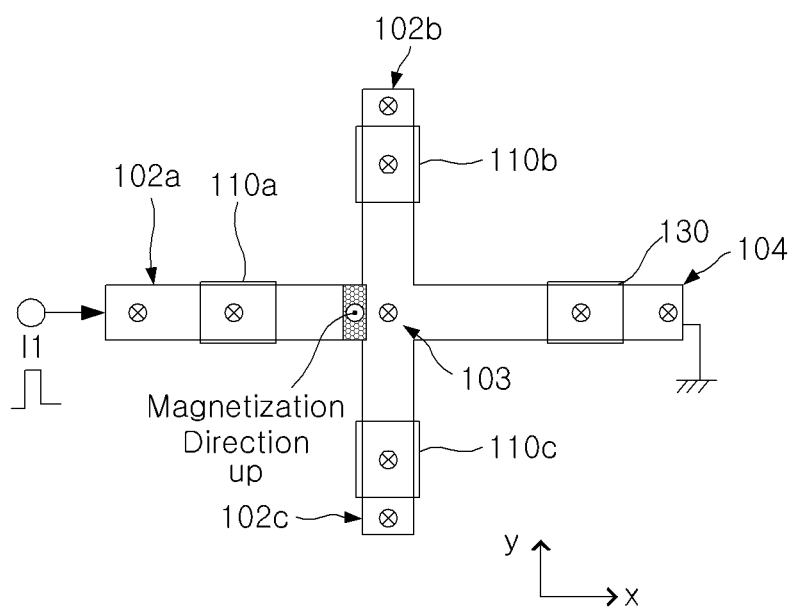
FIG. 6C is a plan view for describing the information shifting and computation operations in the magnetic logic device for the logic operation of [100].

FIG. 6C is a plan view for describing the information shifting and computation operations in the magnetic logic device of the logic operation of [100].

Figure 6D:
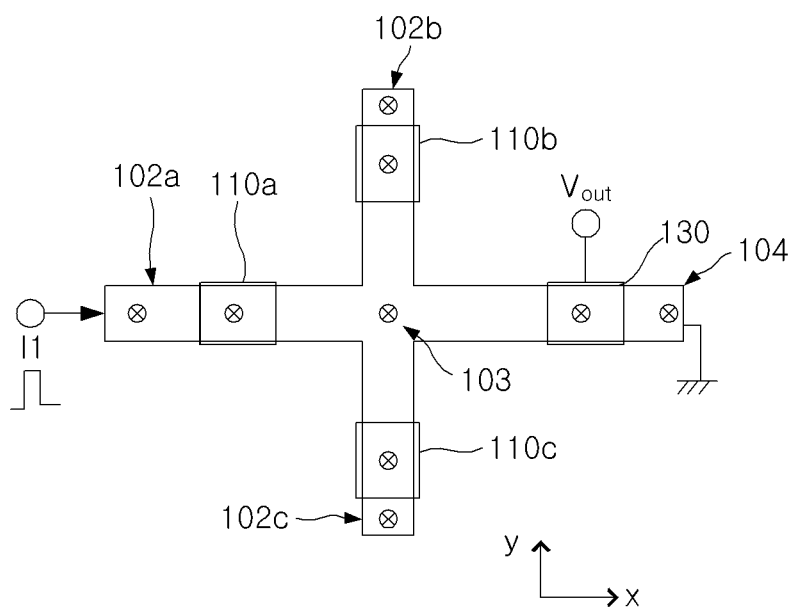
FIG. 6D is a plan view for describing the information detection operation in the magnetic logic device for the logic operation of [100].

FIG. 6D is a plan view for describing the information detection operation in the magnetic logic device of the logic operation of [100].

Figure 7:
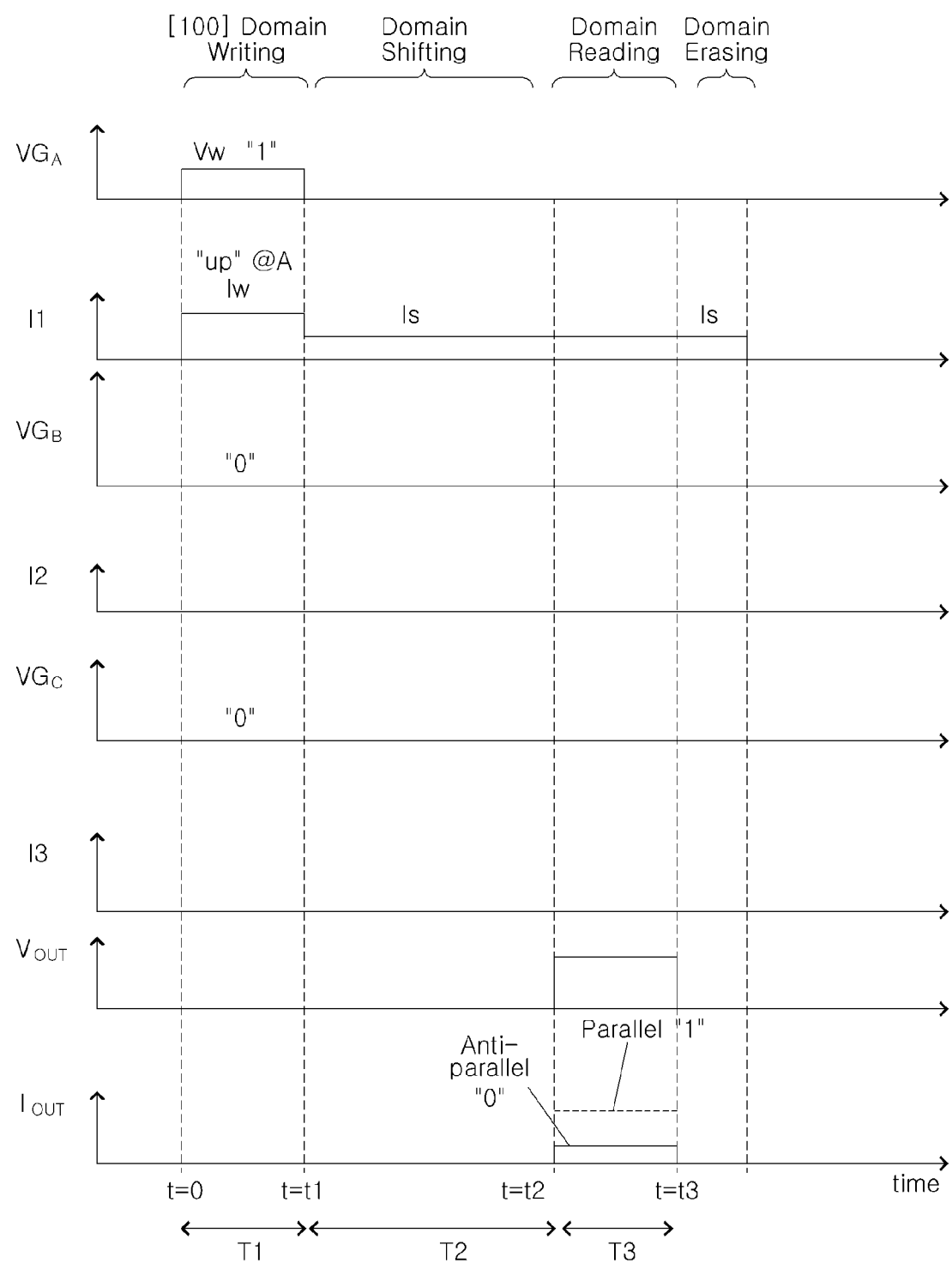
FIG. 7 is a timing diagram illustrating the [100] signal computation of the magnetic logic device.

FIG. 7 is a timing diagram illustrating a [100] signal computation of the magnetic logic device.

Referring to FIGS. 6 and 7, when the written information is [100], the "up" may be written in the first input branch 102a, the "down" may be written in the second input branch 102b, and the "down" may be written in the third input branch 102c.

Specifically, the first write in-plane current Iw is applied to the first input branch 102a and the first gate write voltage $V_w$ is applied to the first gate electrode 110a in the pulse form during the write interval T1. As a result, the first input branch 102a locally performs the magnetization inversion in the free layer 113 corresponding to the first gate electrode.

The second input branch 102b is already maintained to "down" in the initial state, and a gate write voltage is not thus applied and the write operation is not performed.

The third input branch 102c is already maintained to "down" in the initial state, and the gate write voltage is not thus applied and the write operation is not performed.

In the performing of the logic operation at the coupling portion 103 while shifting the written information, the shift in-plane current Is is applied to the input branch 102a in which the information is written. That is, in a state in which the information is written by the magnetization inversion at the first input branch 102a, the shift in-plane current Is is continuously performed in the write in-plane current Iw during a second time interval T2. As a result, the information stored in each of the input branches 102a, 102b, and 102c is shifted to the coupling portion 103 and then is computed, and shifted to the output branch 104.

The logic computing operation may be determined by shift characteristics of the magnetic domain wall. One magnetic domain is distinguished by one pair of magnetic domain walls (first magnetic domain wall and second magnetic domain wall). When one pair of magnetic domain walls are shifted along the first input branch 102a by the shift in-plane current, the first magnetic domain wall 10a may stop at the coupling portion 103 and the subsequent second magnetic domain wall 10b may be shifted up to the coupling portion 103. As a result, when the second magnetic domain wall 10b reaches the first magnetic domain wall 10a, the first magnetic domain wall 10a and the second magnetic domain wall 10b may be extinct.

Figure 8A:
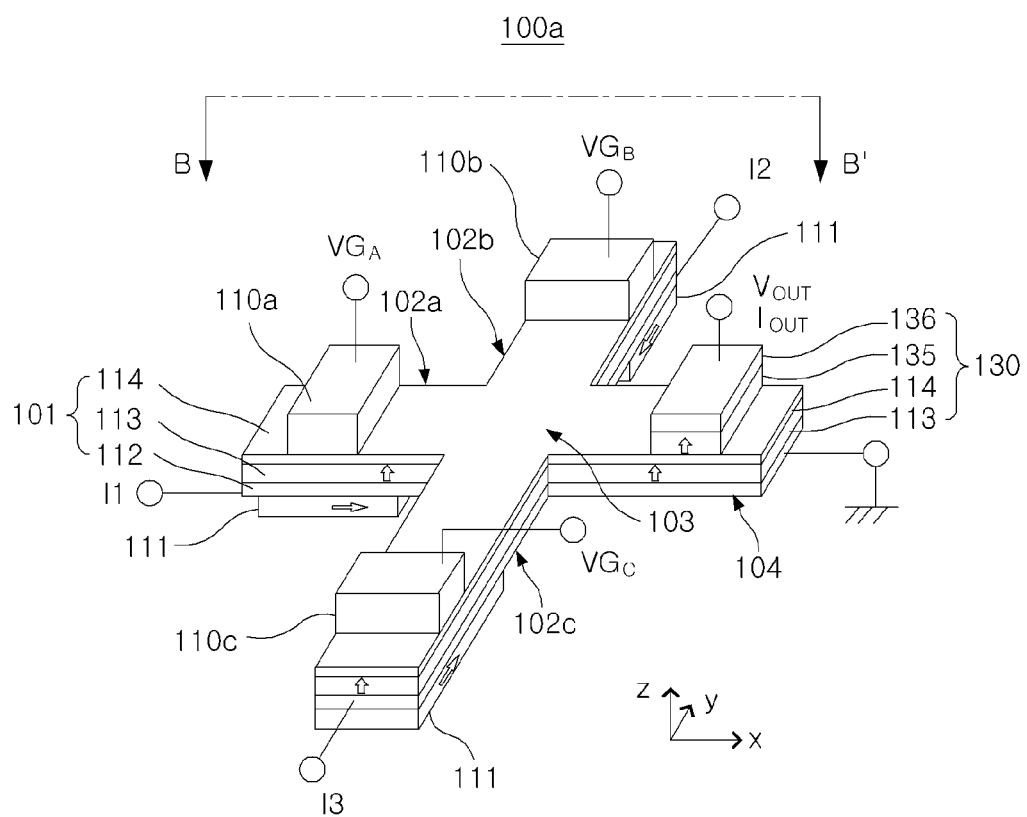
FIG. 8A is a conceptual diagram illustrating a magnetic logic device according to another exemplary embodiment of the present invention.

FIG. 8A is a conceptual diagram illustrating a magnetic logic device according to another exemplary embodiment of the present invention.

Figure 8B:
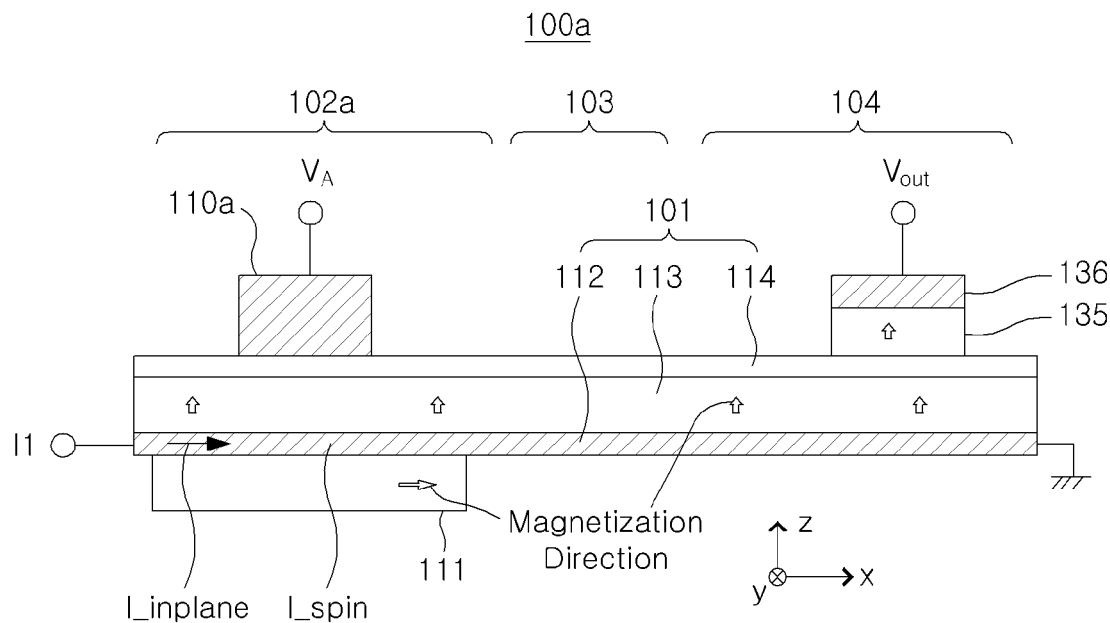
FIG. 8B is a cross-sectional view taken along line B-B' of FIG. 8A.

FIG. 8B is a cross-sectional view taken along line B-B' of FIG. 8A.

Figure 9A:
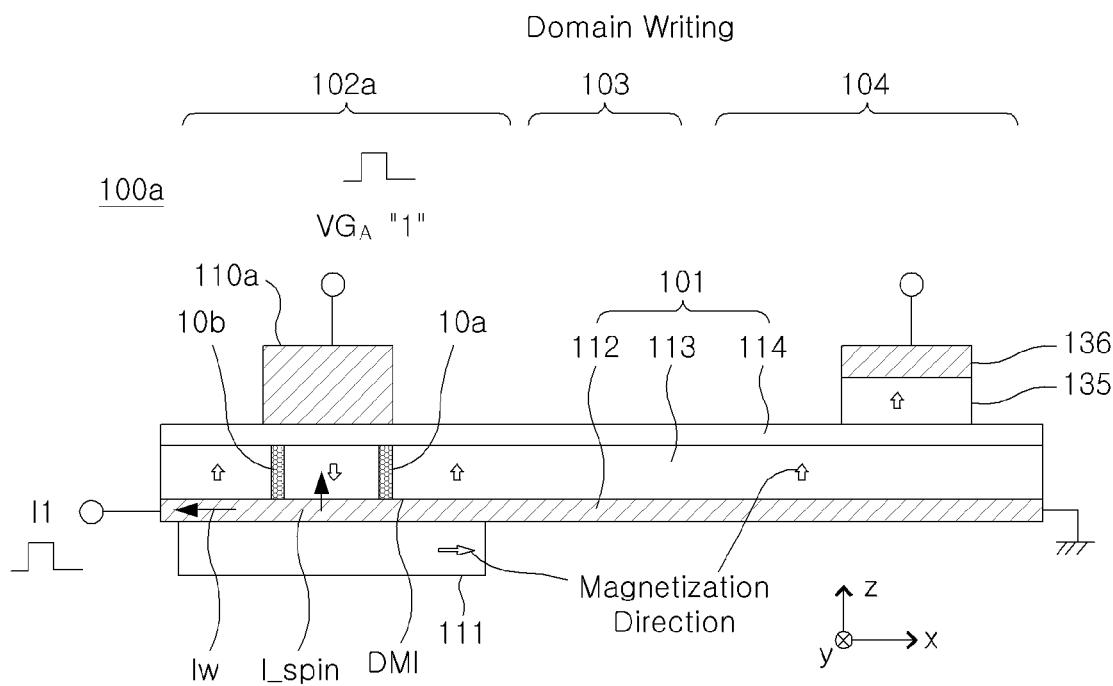
FIG. 9A is a cross-sectional view for describing an information write operation in the magnetic logic device of FIG. 8A.

FIG. 9A is a cross-sectional view for describing an information write operation in the magnetic logic device of FIG. 8A.

Figure 9B:
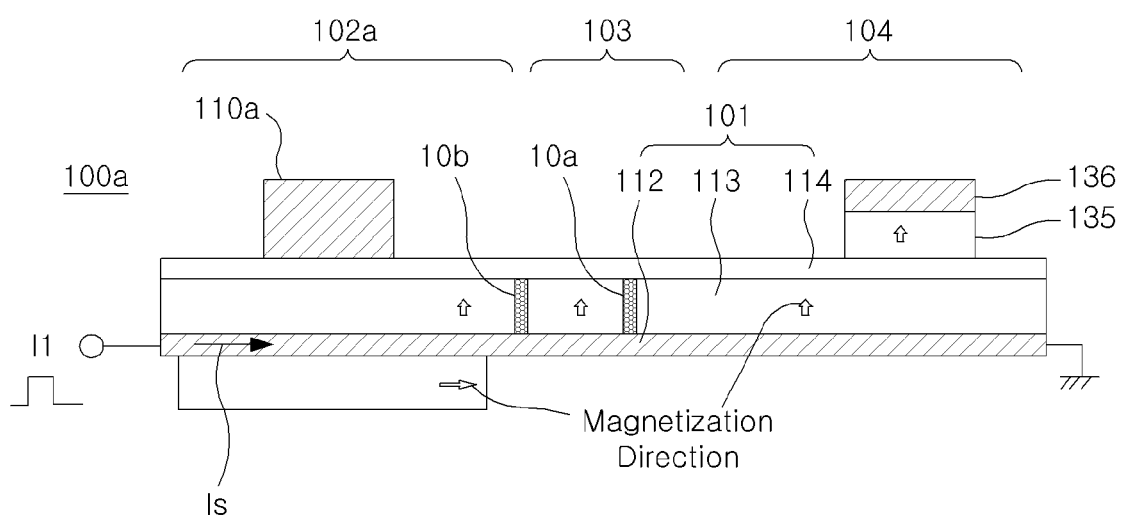
FIG. 9B is a cross-sectional view for describing information shifting and computation operations in the magnetic logic device of FIG. 8A.

FIG. 9B is a cross-sectional view for describing information shifting and computation operations in the magnetic logic device of FIG. 8A.

Figure 9C:
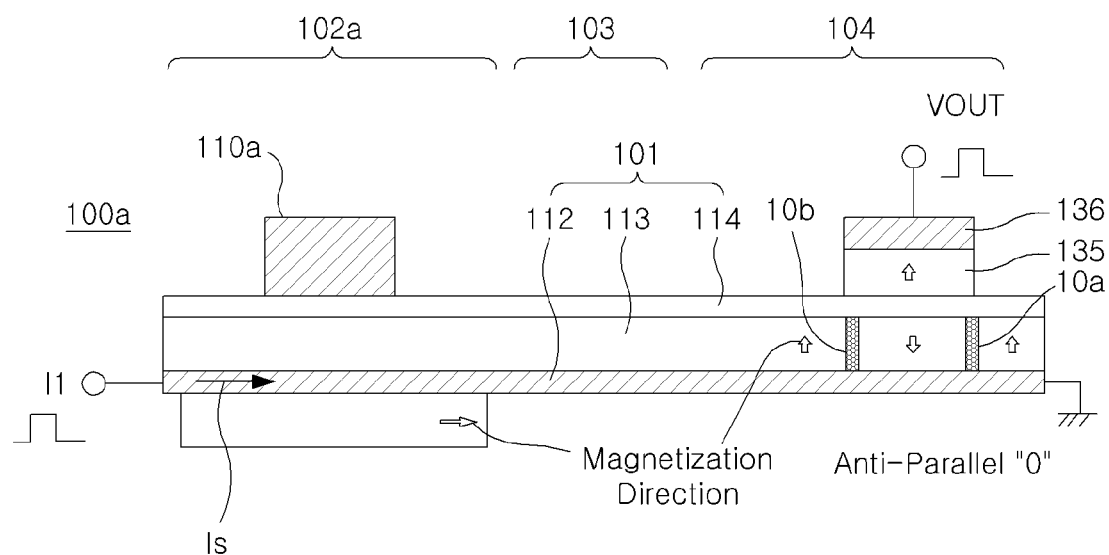
FIG. 9C is a cross-sectional view for describing information detection in the magnetic logic device of FIG. 8A.

FIG. 9C is a cross-sectional view for describing information detection in the magnetic logic device of FIG. 8A.

Figure 10A:
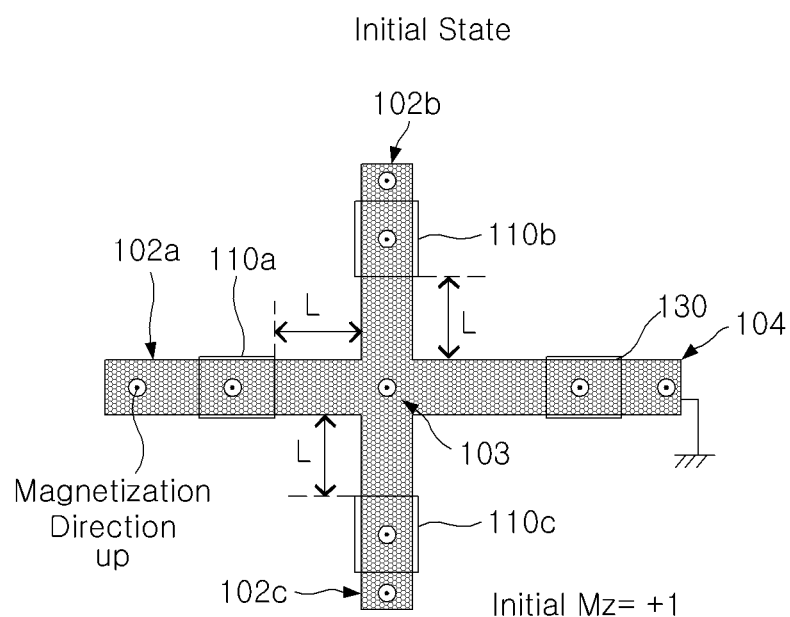
FIG. 10A is a plan view illustrating an initial state of the magnetic logic device of FIG. 8A.

FIG. 10A is a plan view illustrating an initial state of the magnetic logic device of FIG. 8A.

Figure 10B:
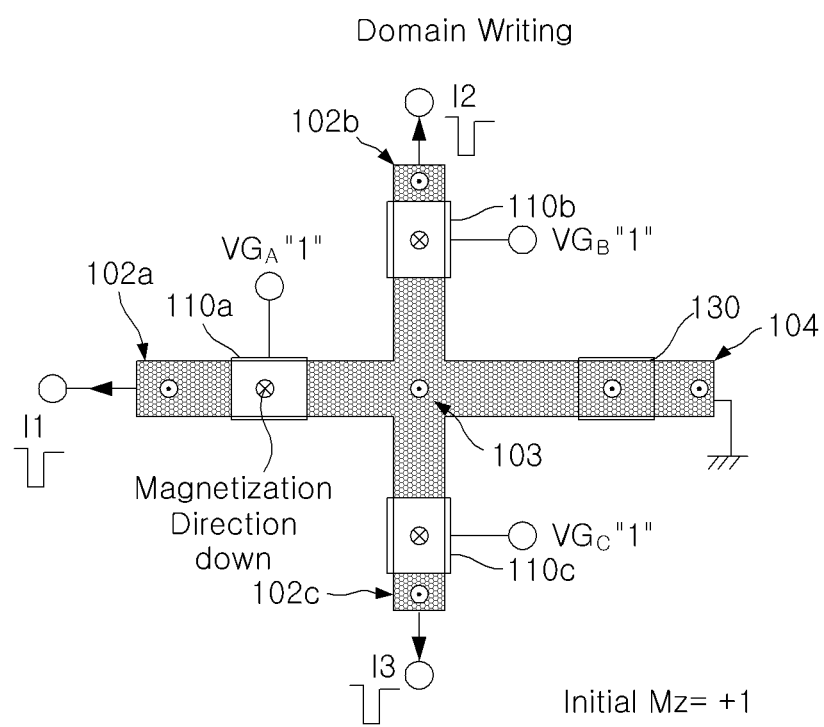
FIG. 10B is a plan view for describing the information write operation in the magnetic logic device of FIG. 8A.

FIG. 10B is a plan view illustrating the information write operation in the magnetic logic device of FIG. 8A.

Figure 10C:
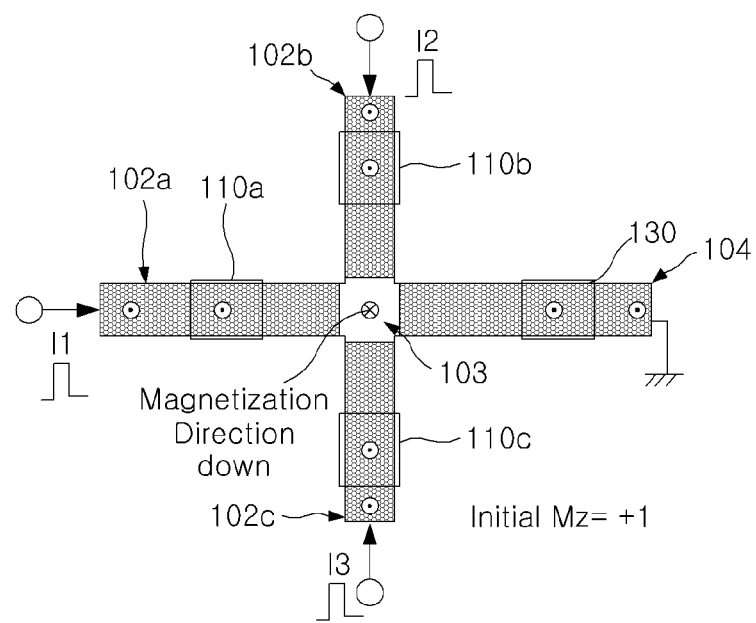
FIG. 10C is a plan view illustrating information shifting and computation operations of the magnetic logic device of FIG. 8A.

FIG. 10C is a plan view illustrating information shifting and computation operations of the magnetic logic device of FIG. 8A.

Figure 10D:
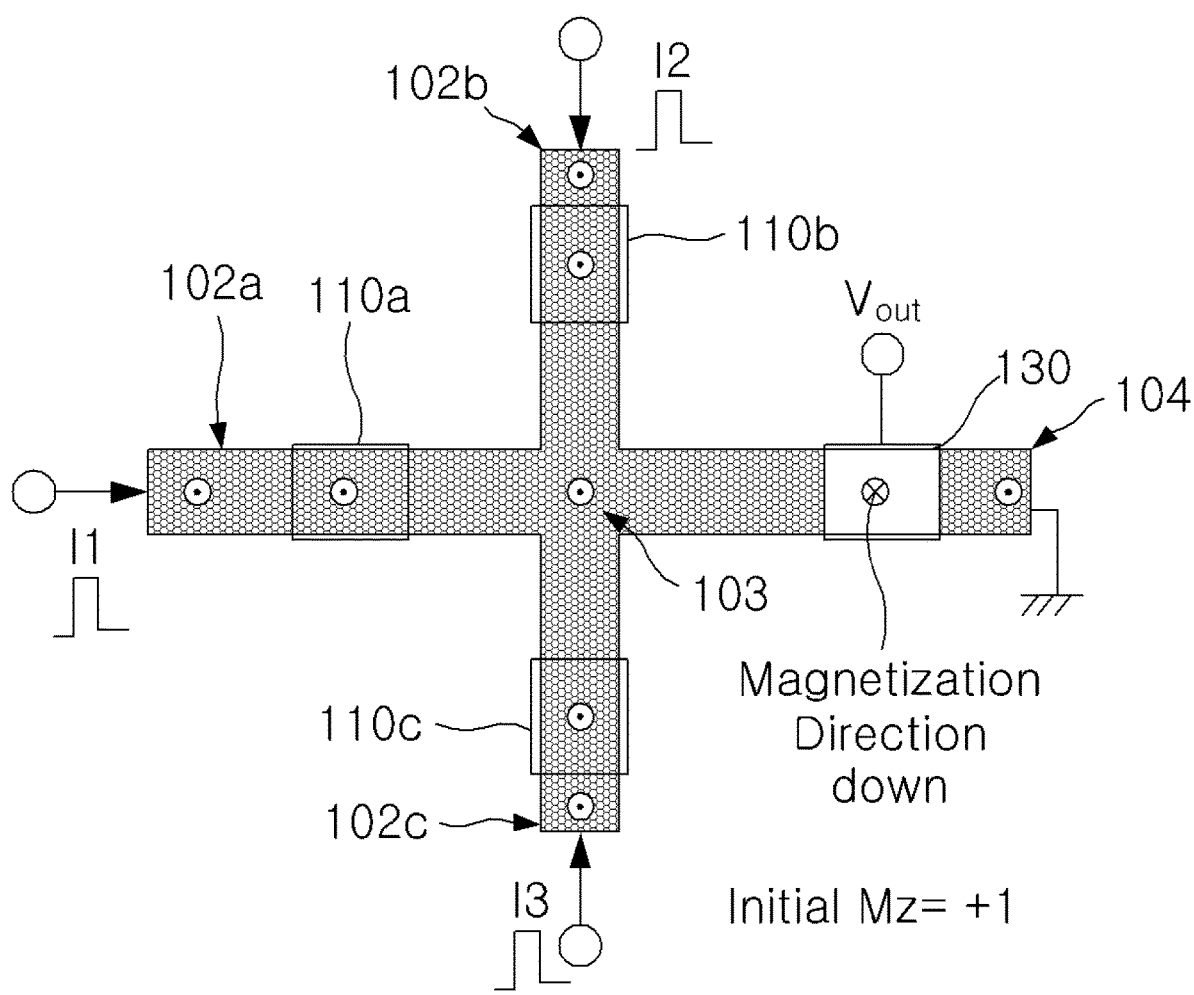
FIG. 10D is a plan view illustrating the information detection operation of the magnetic logic device of FIG. 8A.

FIG. 10D is a plan view illustrating the information detection operation of the magnetic logic device of FIG. 8A.

Figure 11:
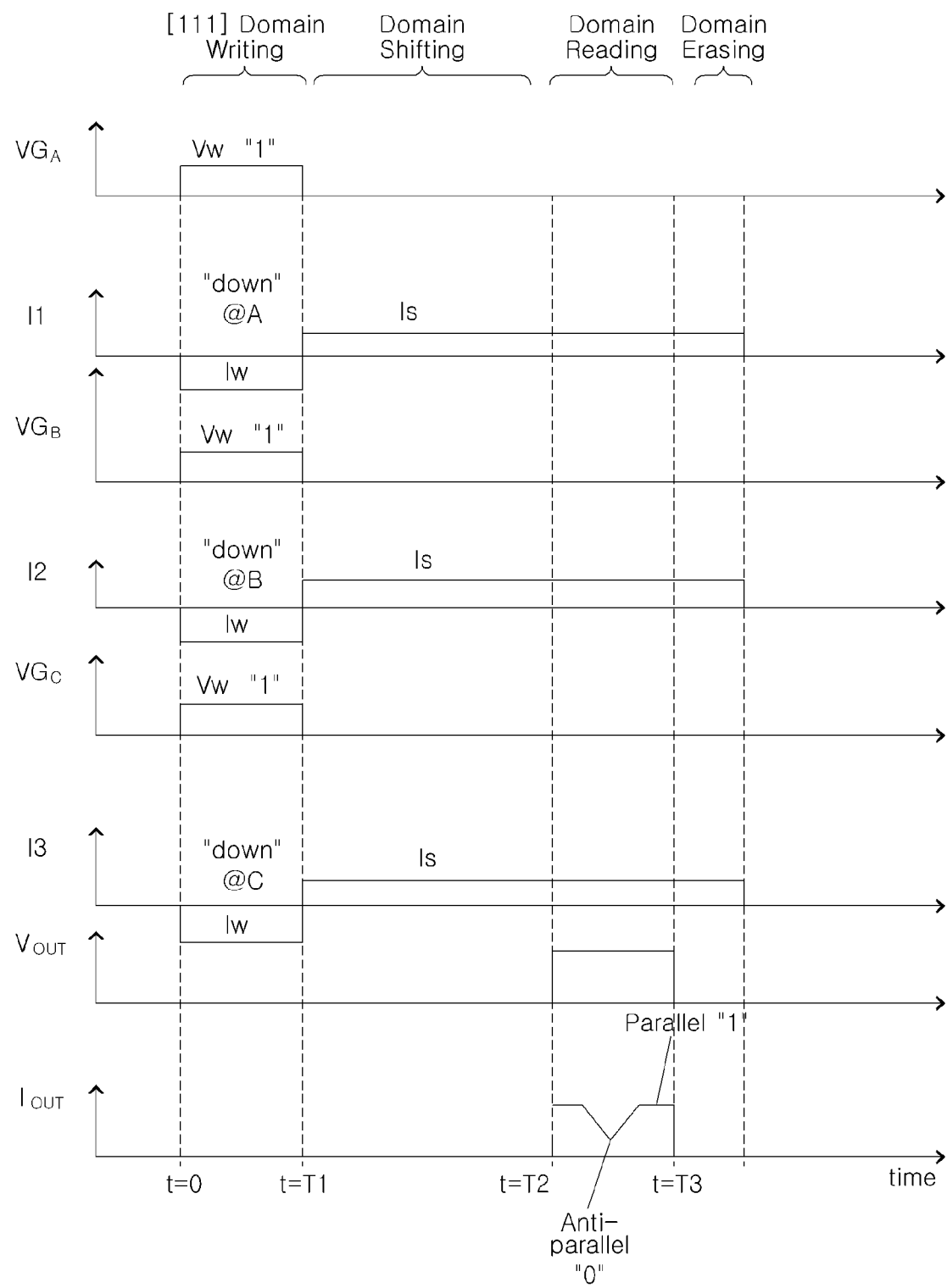
FIG. 11 is a timing chart of the magnetic logic device of FIG. 8A.

FIG. 11 is a timing chart of the magnetic logic device of FIG. 8A.

FIG. 12 illustrates a logic operation result of the magnetic logic device of FIG. 8A.

Referring to FIGS. 8 to 12, the magnetic logic device 100a includes: a plurality of input branches 102a, 102b, and 102c configured by a magnetic nanowire 101 including a non-magnetic metallic layer 112, a free layer 113, and an insulating layer 114 sequentially stacked; an output branch 104 configured by the magnetic nanowire 101; a coupling portion 103 configured by the magnetic nanowire 101 and where the input branches 102a, 102b, and 102c, and the output branch 104 meet; gate electrodes 110a, 110b, and 110c arranged adjacent to the insulating layer 114 in each of the plurality of input branches 102a, 102b, and 102c; and in-plane anisotropic ferromagnetic layers 111 arranged adjacent to the non-magnetic metallic layer 112 in each of the plurality of input branches 102a, 120b, and 102c. A gate voltage (VG) applied to the gate electrodes 110a, 110b, and 110c reduces the perpendicular magnetic anisotropy of the free layer 113. The free layer 113 has the perpendicular magnetic anisotropy. A write in-plane current (Iw) applied to the input branches 102a, 102b, and 102c is synchronized with the gate voltage (VG), and locally provides, to the magnetic domain initially magnetized to the first state, magnetization inversion by the perpendicular magnetic anisotropy reduced by the gate voltage (VG). One pair of magnetic domain walls formed by the magnetization inversion are chiral Neel magnetic domain walls 10a and 10b.

The magnetic nanowire 101 may be initialized to the "up" state.

In the writing of the information, the gate voltage may be applied to the gate electrodes 110a, 110b, and 110c according to the written information and the write in-plane current may be applied to the input branches 102a, 102b, and 102c. One end of the output branch 104 may be grounded.

For example, in the initial state, the input branches 102a, 102b, and 102c, the coupling portion 103, and the output branch 104 may all be in the "up" state.

When the written information is [111], the "down" may be written in the first input branch 102a, the "down" may be written in the second input branch 102b, and the "down" may be written in the third input branch 102c.

Specifically, the first write in-plane current Iw is applied to the first input branch 102a and the first gate write voltage $V_w$ is applied to the first gate electrode 110a in the pulse form during the write interval T1. As a result, the first input branch 102a locally performs the magnetization inversion in the free layer 113 corresponding to the first gate electrode. However, the first write in-plane current Iw may flow toward the first input branch from the output branch. That is, when the first write current Iw is defined as a positive value if the first write current Iw flows toward the output branch from the first input branch, the first write current Iw may have a negative value. The negative first written current is caused by a spin orbit torque for magnetization inversion from the "up" to the "down".

The second write in-plane current Iw is applied to the second input branch 102a and the second gate write voltage $V_w$ is applied to the second gate electrode during the write interval T1. As a result, the second input branch locally performs the magnetization inversion from the "up" state to the "down" state in the free layer 113 corresponding to the second gate electrode.

The third write in-plane current Iw is applied to the third input branch 102c and the third gate write voltage $V_w$ is applied to the third gate electrode during the write interval T1. As a result, the third input branch locally performs the magnetization inversion from the "up" state to the "down" state in the free layer 113 corresponding to the third gate electrode.

In the performing of the logic operation at the coupling portion 103 while shifting the written information, the shift in-plane current Is is applied to each of the input branches in which the information is written. The shift in-plane current Is may have the positive value. That is, in a state in which the information is written by the magnetization inversion at the first input branch 102a, the shift in-plane current Is is continuously performed in the write in-plane current Iw during a second time interval T2. As a result, the information stored in each of the input branches 102a, 102b, and 102c is shifted to the coupling portion 103 and then is computed, and shifted to the output branch 104.

When the magnetic nanowire 101 is initially initialized to the "up" state (Mz=+1), and up to one of the information inputted into three input branches 102a, 102b, and 102c is the "down" state (Mz=−1), the output branch 104 outputs the "up" state (Mz=+1). Meanwhile, when two or more of the information inputted into three input branches 102a, 102b, and 102c are in the "down" state (Mz=−1), the output branch 104 outputs the "down" state (Mz=−1). As a result, the magnetic logic device may perform NAND and NOR operations.

Figure 13:
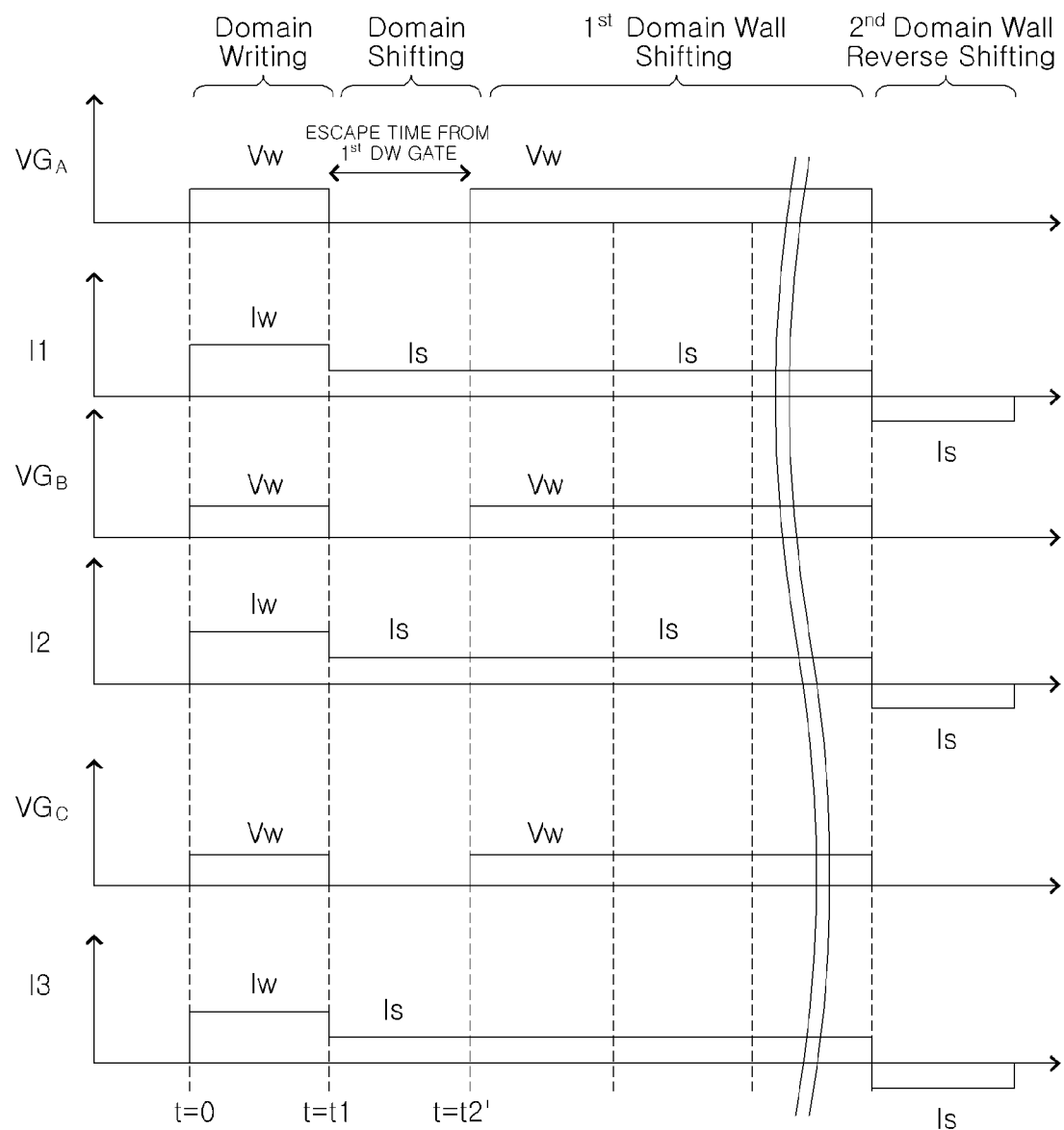
FIG. 13 is a timing diagram for describing an operation of changing the logic operation of the magnetic logic device.

FIG. 13 is a timing diagram for describing an operation of changing the logic operation of the magnetic logic device.

Figure 14A:
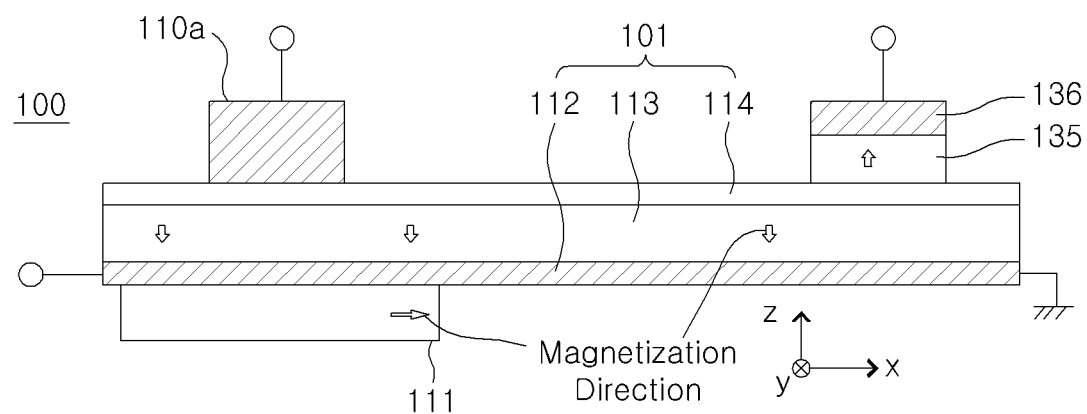
FIG. 14A is a cross-sectional view for describing a "down" initial state of a magnetic logic device.

FIG. 14A is a cross-sectional view for describing a "down" initial state of the magnetic logic device.

Figure 14B:
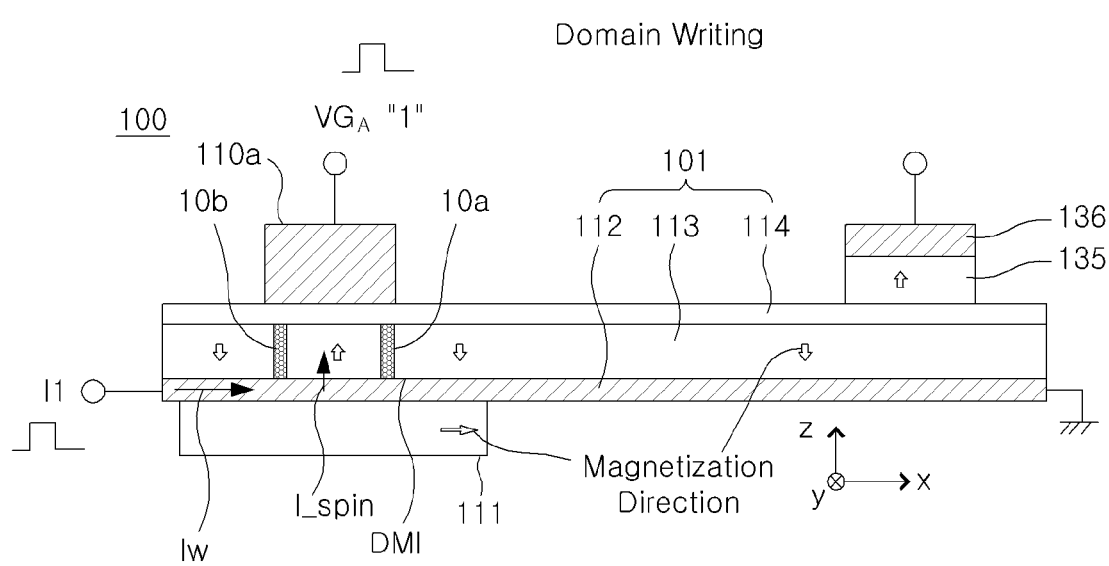
FIG. 14B is a cross-sectional view for describing a magnetic domain writing step for changing the initial state of the magnetic logic device.

FIG. 14B is a cross-sectional view for describing a magnetic domain writing step for changing the initial state of the magnetic logic device.

Figure 14C:
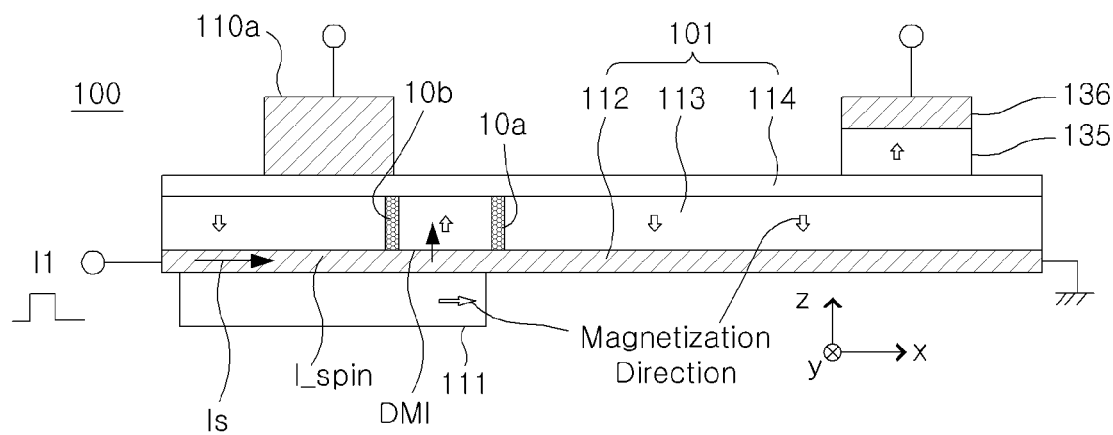
FIG. 14C is a cross-sectional view for describing a step of shifting a magnetic domain wall to an end of a gate electrode for changing the initial state of the magnetic logic device.

FIG. 14C is a cross-sectional view for describing a magnetic domain shifting step to an end of a gate electrode for changing the initial state of the magnetic logic device.

Figure 14D:
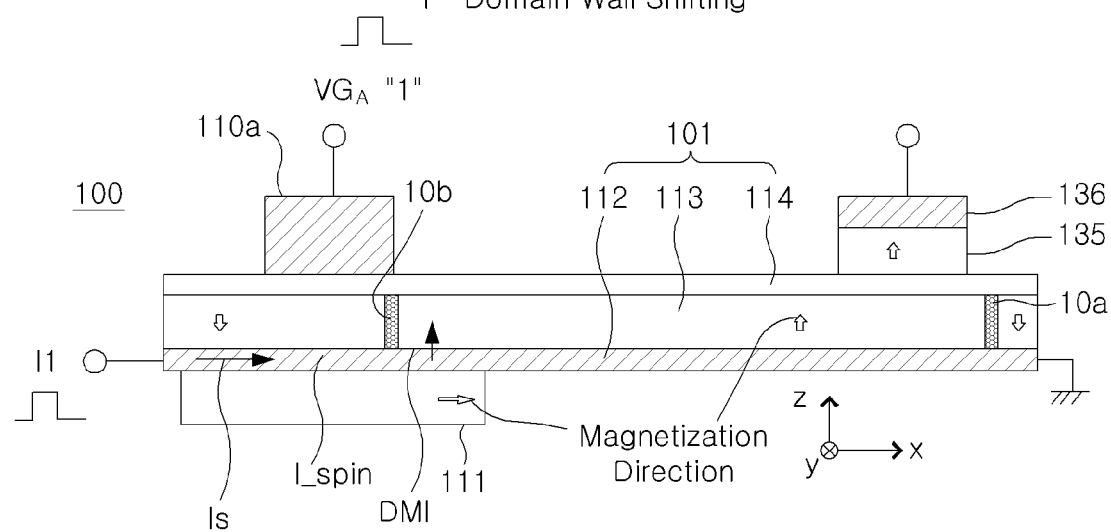
FIG. 14D is a cross-sectional view for describing a step of shifting a first magnetic domain wall to a right side for changing the initial state of the magnetic logic device.

FIG. 14D is a cross-sectional view for describing a step of shifting a first magnetic domain wall to a right side for changing the initial state of the magnetic logic device.

Figure 14E:
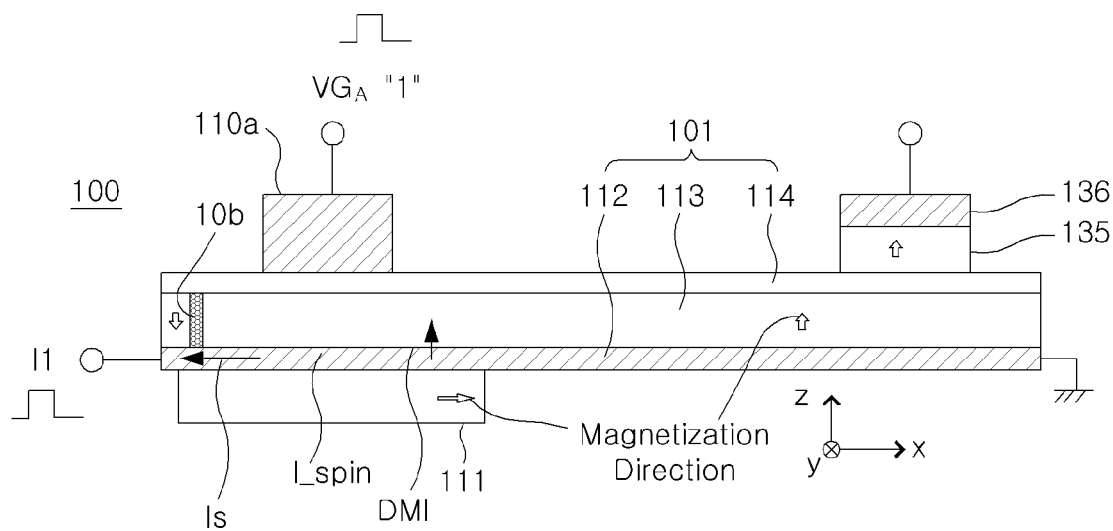
FIG. 14E is a cross-sectional view for describing a step of shifting a second magnetic domain wall to a left side for changing the initial state of the magnetic logic device.

FIG. 14E is a cross-sectional view for describing a step of shifting a second magnetic domain wall to a left side for changing the initial state of the magnetic logic device.

Referring to FIGS. 13 and 14A, the initial magnetization state of the magnetic nanowire 101 is changed. The magnetic nanowire 101 is changed from the "down" state to the "up" state. When the magnetic nanowire 101 has the "down" state as the initial state, the AND or OR logic operation may be performed. Meanwhile, when the magnetic nanowire 101 has the "up" state as the initial state, the NAND or NOR logic operation may be performed.

Referring to FIG. 14B, in the magnetic domain writing step, the magnetization inversion occurs from the "down" state to the "up" state. That is, the magnetization inversion of the free layer is performed by applying the write in-plane current Iw to the non-magnetic metallic layer 113 of all input branches while applying the gate voltage VG to each of all gate electrodes 110a, 110b, and 110c to form the first and second magnetic domain walls 10a and 10b. That is, the [111] information is written.

Referring to FIG. 14C, the second magnetic domain wall is shifted to the boundary of the gate electrode by applying the shift in-plane current Is to the non-magnetic metallic layer of all input branches while removing the gate voltage of each of all gate electrodes. The first magnetic domain wall is shifted to the right side and the second magnetic domain wall is shifted to the boundary of the gate electrode.

Referring to FIG. 14D, the first magnetic domain wall is shifted to the end of the output branch while peening the second magnetic domain wall by applying the shift in-plane current to the non-magnetic metallic layer of all input branches while removing the gate voltage of each of all gate electrodes.

The first magnetic domain wall is shifted to the end of the output branch through the coupling portion by the shift in-plane current. Meanwhile, the second magnetic domain wall is peened by the gate voltage. Meanwhile, the shift in-plane current is smaller than the write in-plane current, and as a result, the magnetization inversion may not be performed.

Referring to FIG. 14E, the second magnetic domain wall 10b is shifted to input terminals of the input branches 102a, 102b, 102c, and 102d by applying an opposite shift in-plane current Is to the non-magnetic metallic layer of all input branches while removing the gate voltage VG of each of all gate electrodes 110a, 110b, 110c, and 110d. As a result, the magnetization of the magnetic nanowire is all changed to the "up" state.

Figure 15:
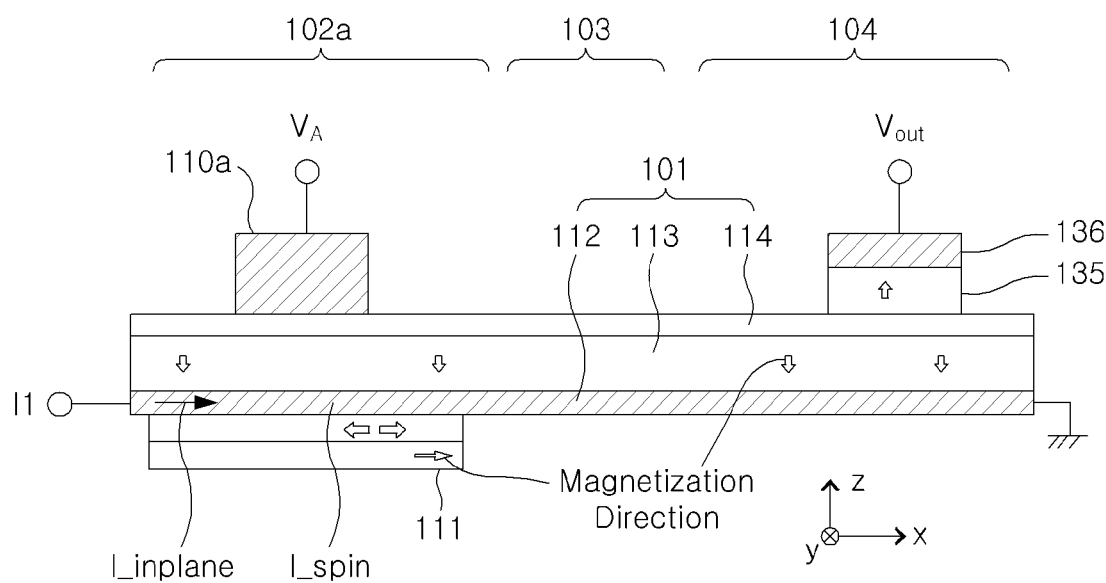
FIG. 15 is a conceptual diagram illustrating a magnetic logic device according to yet another exemplary embodiment of the present invention.

FIG. 15 is a conceptual diagram illustrating a magnetic logic device according to yet another exemplary embodiment of the present invention.

Referring to FIG. 15, the magnetic logic device 200 includes: a plurality of input branches 102a, 102b, and 102c configured by a magnetic nanowire 101 including a non-magnetic metallic layer 112, a free layer 113, and an insulating layer 114 sequentially stacked; an output branch 104 configured by the magnetic nanowire 101; a coupling portion 103 configured by the magnetic nanowire 101 and where the input branches 102a, 102b, and 102c, and the output branch 104 meet; gate electrodes 110a, 110b, and 110c arranged adjacent to the insulating layer 114 in each of the plurality of input branches 102a, 102b, and 102c; and in-plane anisotropic ferromagnetic layers 111 arranged adjacent to the non-magnetic metallic layer 112 in each of the plurality of input branches 102a, 120b, and 102c. The gate voltage (VG) applied to the gate electrodes 110a, 110b, and 110c reduces the perpendicular magnetic anisotropy of the free layer 113. The free layer 113 has the perpendicular magnetic anisotropy. A write in-plane current (Iw) applied to the input branches 102a, 102b, and 102c is synchronized with the gate voltage (VG), and locally provides, to the magnetic domain initially magnetized to the first state, magnetization inversion by the perpendicular magnetic anisotropy reduced by the gate voltage (VG). One pair of magnetic domain walls formed by the magnetization inversion are Neel magnetic domain walls 10a and 10b.

The exchange bias magnetic field or the stray magnetic field may be formed by the anti-ferromagnetic layer 211/the in-plane magnetic anisotropic ferromagnetic layer 111 having in-plane magnetic anisotropy. The anti-ferromagnetic layer 211 may be disposed between the in-plane magnetic anisotropic ferromagnetic layer 111 and the non-magnetic conductive layer 112, and have the in-plane magnetic anisotropy.

Figure 16A:
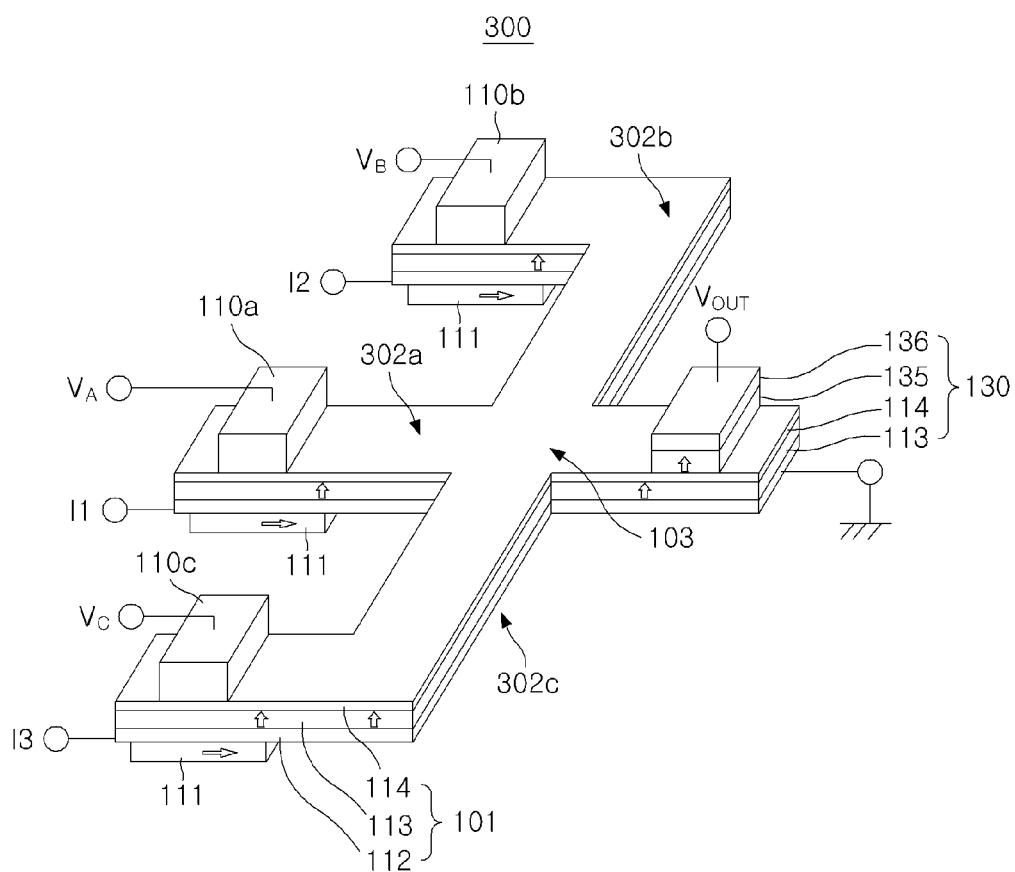
FIG. 16A is a conceptual diagram illustrating a magnetic logic device according to still yet another exemplary embodiment of the present invention.

FIG. 16A is a conceptual diagram illustrating a magnetic logic device according to still yet another exemplary embodiment of the present invention.

Figure 16B:
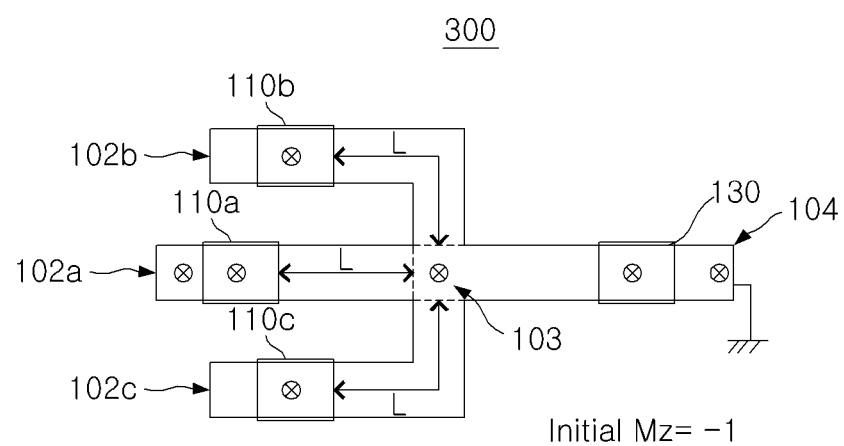
FIG. 16B is a plan view illustrating the magnetic logic device of FIG. 16A.

FIG. 16B is a plan view illustrating the magnetic logic device of FIG. 16A.

Referring to FIGS. 16A and 16B, the magnetic logic device 300 includes: a plurality of input branches 302a, 302b, and 302c configured by a magnetic nanowire 101 including a non-magnetic metallic layer 112, a free layer 113, and an insulating layer 114 sequentially stacked; an output branch 104 configured by the magnetic nanowire 101; a coupling portion 103 configured by the magnetic nanowire 101 and where the input branches 302a, 302b, and 302c, and the output branch 104 meet; gate electrodes 110a, 110b, and 110c arranged adjacent to the insulating layer 114 in each of the plurality of input branches 302a, 302b, and 302c; and in-plane anisotropic ferromagnetic layers 111 arranged adjacent to the non-magnetic metallic layer 112 in each of the plurality of input branches 302a, 320b, and 302c. The gate voltage (VG) applied to the gate electrodes 110a, 110b, and 110c reduces the perpendicular magnetic anisotropy of the free layer 113. The free layer 113 has the perpendicular magnetic anisotropy. A write in-plane current (Iw) applied to the input branches 302a, 302b, and 302c is synchronized with the gate voltage (VG), and locally provides, to the magnetic domain initially magnetized to the first state, magnetization inversion by the perpendicular magnetic anisotropy reduced by the gate voltage (VG). One pair of magnetic domain walls formed by the magnetization inversion are Neel magnetic domain walls 10a and 10b.

The first input branch may be disposed on a straight line with the output branch. Each of the second input branch and the third input branch may be bent at 90 degrees and connected to the coupling portion. The input branches 302a, 302b, and 302c may have the same length L. As a result, one pair of magnetic domain walls may meet at the same time at the coupling portion by the shift in-plane current Is and perform a computation operation.

While the present invention has been shown and described with respect to certain preferred embodiments hereinabove, the present invention is not limited to the embodiments, and includes all of various exemplary embodiments which can be implemented by those skilled in the art to which the present invention pertains within a scope without departing from the technical spirit of the present invention.

What is claimed is:

1. A magnetic logic device comprising:
a plurality of input branches configured by a magnetic nanowire including a non-magnetic metallic layer, a free layer, and an insulating layer sequentially stacked;
an output branch configured by the magnetic nanowire;
a coupling portion configured by the magnetic nanowire and where the input branches and the output branch meet;
gate electrodes arranged adjacent to the insulating layer in each of the plurality of input branches; and
in-plane anisotropic ferromagnetic layers arranged adjacent to the non-magnetic metallic layer in each of the plurality of input branches,
wherein a gate voltage applied to the gate electrodes reduces the magnetic anisotropy of the free layer,
the free layer has the perpendicular magnetic anisotropy,
the non-magnetic metallic layer and the free layer provide antisymmetric interaction,
the write in-plane current applied to the input branch is synchronized with the gate voltage and locally provides, to a magnetic domain initially magnetized to a first state, magnetization inversion by magnetic anisotropy reduced by the gate voltage,
the magnetization inversion forms one pair of Neel magnetic domain walls, and
information written in each of the input branches is shifting to a shift in-plane current and performing a logic operation at the coupling portion, and outputting an operation result to the output branch.

2. The magnetic logic device of claim 1, wherein the non-magnetic metallic layer is Pt, and
the free layer is CoFeB.

3. The magnetic logic device of claim 1, wherein the number of input branches is 3,
the input branches and the output branches are arranged in a cross form, and
when the first state is a "down" state, the logic operation is to perform AND and OR operations.

4. The magnetic logic device of claim 1, wherein the number of input branches is 3,
the input branches and the output branches are arranged in the cross form, and
when the first state is an "up" state, the logic operation is to perform NAND and NOR operations.

5. The magnetic logic device of claim 1, further comprising:
a fixation layer disposed adjacent to the insulating layer in the output branch,
wherein the free layer, the insulating layer, and the fixation layer provide magnetic tunnel junction and the magnetic tunnel junction detects the operation result.

6. An operating method of a magnetic logic device including: a plurality of input branches configured by a magnetic nanowire including a non-magnetic metallic layer, a free layer, and an insulating layer sequentially stacked; an output branch configured by the magnetic nanowire; a coupling portion configured by the magnetic nanowire and where the input branches and the output branch meet; gate electrodes arranged adjacent to the insulating layer in each of the plurality of input branches; and in-plane anisotropic ferromagnetic layers arranged adjacent to the non-magnetic metallic layer in each of the plurality of input branches, the method comprising:
writing information by performing magnetization inversion of the free layer by applying the write in-plane current to the non-magnetic metallic layer of the input branches while applying the gate voltage to each of the gate electrodes to correspond to information provided from the outside;
performing the logic operation in the coupling portion while shifting the written information by applying the shift in-plane current Is to the non-magnetic metallic layer of the input branches; and detecting information logically computed by the shift in-plane current of the non-magnetic metallic layer through a magnetic tunnel junction structure by shifting the information to the output branch.

7. The method of claim 6, further comprising:

changing an initial magnetization state of the magnetic nanowire.

8. The method of claim 7, wherein the changing of the initial magnetization state of the magnetic nanowire includes forming first and second magnetic domain walls by performing magnetization inversion of the free layer by applying a write in-plane current to the non-magnetic metallic layer of all input branches while applying a gate voltage to each of all gate electrodes, shifting the second magnetic domain wall to a boundary of the gate electrode by applying the shift in-plane current to the non-magnetic metallic layer of all input branches while removing the gate voltage of each of all gate electrodes, shifting the first magnetic domain wall to the end of the output branch while peening the second magnetic domain wall by applying the shift in-plane current to the non-magnetic metallic layer of all input branches while applying the gate voltage to each of all gate electrodes, and shifting the second magnetic domain wall to input terminals of the input branches by applying an opposite shift in-plane current to the non-magnetic metallic layer of all input branches while removing the gate voltage of each of all gate electrodes.

* * * * *